US012738955B2

(12) United States Patent
Nam et al.

(10) Patent No.: US 12,738,955 B2
(45) Date of Patent: Sep. 15, 2026

(54) DIGITAL-TO-ANALOG CONVERTER CIRCUIT AND ELECTRONIC DEVICE INCLUDING SAME AND METHOD FOR CONTROLLING SAME

(71) Applicant: SAMSUNG ELECTRONICS CO., LTD., Suwon-si (KR)

(72) Inventors: Sangpil Nam, Suwon-si (KR); Byungwoo Koo, Suwon-si (KR); Sunghan Do, Suwon-si (KR); Jungho Lee, Suwon-si (KR); Youngjae Cho, Suwon-si (KR); Michael Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 148 days.

(21) Appl. No.: 18/741,403

(22) Filed: Jun. 12, 2024

(65) Prior Publication Data

US 2025/0175190 A1 May 29, 2025

(30) Foreign Application Priority Data

Nov. 23, 2023 (KR) ........................ 10-2023-0164865

(51) Int. Cl.
*H03M 1/72* (2006.01)
*H03K 3/84* (2006.01)
*H03M 1/66* (2006.01)

(52) U.S. Cl.
CPC ................ *H03M 1/66* (2013.01); *H03K 3/84* (2013.01)

(58) Field of Classification Search
CPC .......... H03M 1/66; H03M 1/662; H03M 9/00; H03M 1/066; H03M 1/067; H03M 1/74; H03M 1/002; H03M 7/165; H03K 3/84
(Continued)

(56) References Cited

U.S. PATENT DOCUMENTS 6,466,147 B1 10/2002 Jensen et al.
7,209,063 B2 4/2007 Sekimoto
(Continued)

FOREIGN PATENT DOCUMENTS

CN 104852733 B 4/2018
CN 104852734 B 4/2018
KR 10-2021-0056544 A 5/2021

OTHER PUBLICATIONS

Koo, Byeongwoo et al., "A 12-bit 8GS/s RF Sampling DAC with Code-Dependent Nonlinearity Compensation and Intersegmental Current-Mismatch Calibration in 5nm FinFET", 2022 Symposium on VLSI Technology & Circuits Digest of Technical Papers, IEEE, Jun. 12, 2022, pp. 86-87, XP034154284. (2 pAges total).
(Continued)

*Primary Examiner* — Jean B Jeanglaude
(74) *Attorney, Agent, or Firm* — Sughrue Mion, PLLC

(57) ABSTRACT

A digital-to-analog converter (DAC) circuit is provided. The DAC circuit includes: a serializer circuit including a plurality of multiplexers and configured to convert a parallel code in digital form into a serial code using the plurality of multiplexers; and a cell array including a plurality of unit cells and configured to output an analog signal based on the serial code. The serializer circuit includes: a pseudo random number generation circuit configured to generate random numbers in response to edges of a first clock signal; a first switch circuit connected to a first multiplexer; a second switch circuit connected to a second multiplexer; and a random number circuit configured to transmit different random numbers generated by the pseudo random number generation circuit in response to different edges of the first clock signal to the first switch circuit and the second switch circuit, respectively.

20 Claims, 15 Drawing Sheets

(58) Field of Classification Search
USPC .......................................... 341/144, 146, 100
See application file for complete search history.

(56) References Cited

U.S. PATENT DOCUMENTS

| | | | | |
|---|---|---|---|---|
| 7,868,806 | B2 | 1/2011 | Seo et al. | |
| 9,384,370 | B1 | 7/2016 | Choi | |
| 9,438,268 | B2 | 9/2016 | Mitani et al. | |
| 9,571,927 | B2 | 2/2017 | Lesso | |
| 10,965,299 | B1 | 3/2021 | Kim et al. | |
| 2023/0253991 | A1* | 8/2023 | Blin ..................... | H04B 1/1607 455/552.1 |

OTHER PUBLICATIONS

Communication issued Apr. 11, 2025 by the European Patent Office in European Patent Application No. 24210690.4.

* cited by examiner

【FIG. 1】
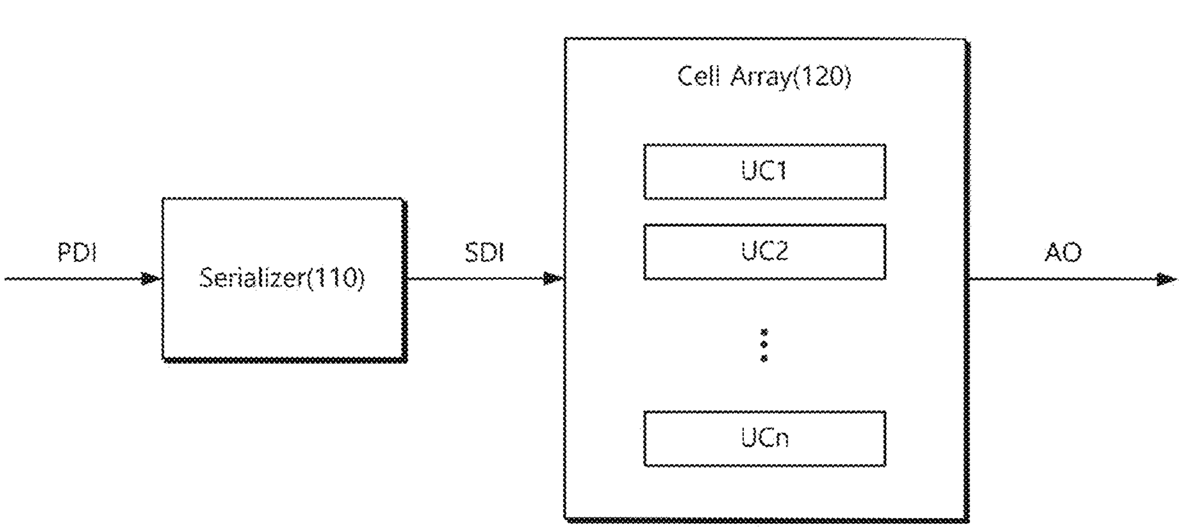

【FIG. 2】
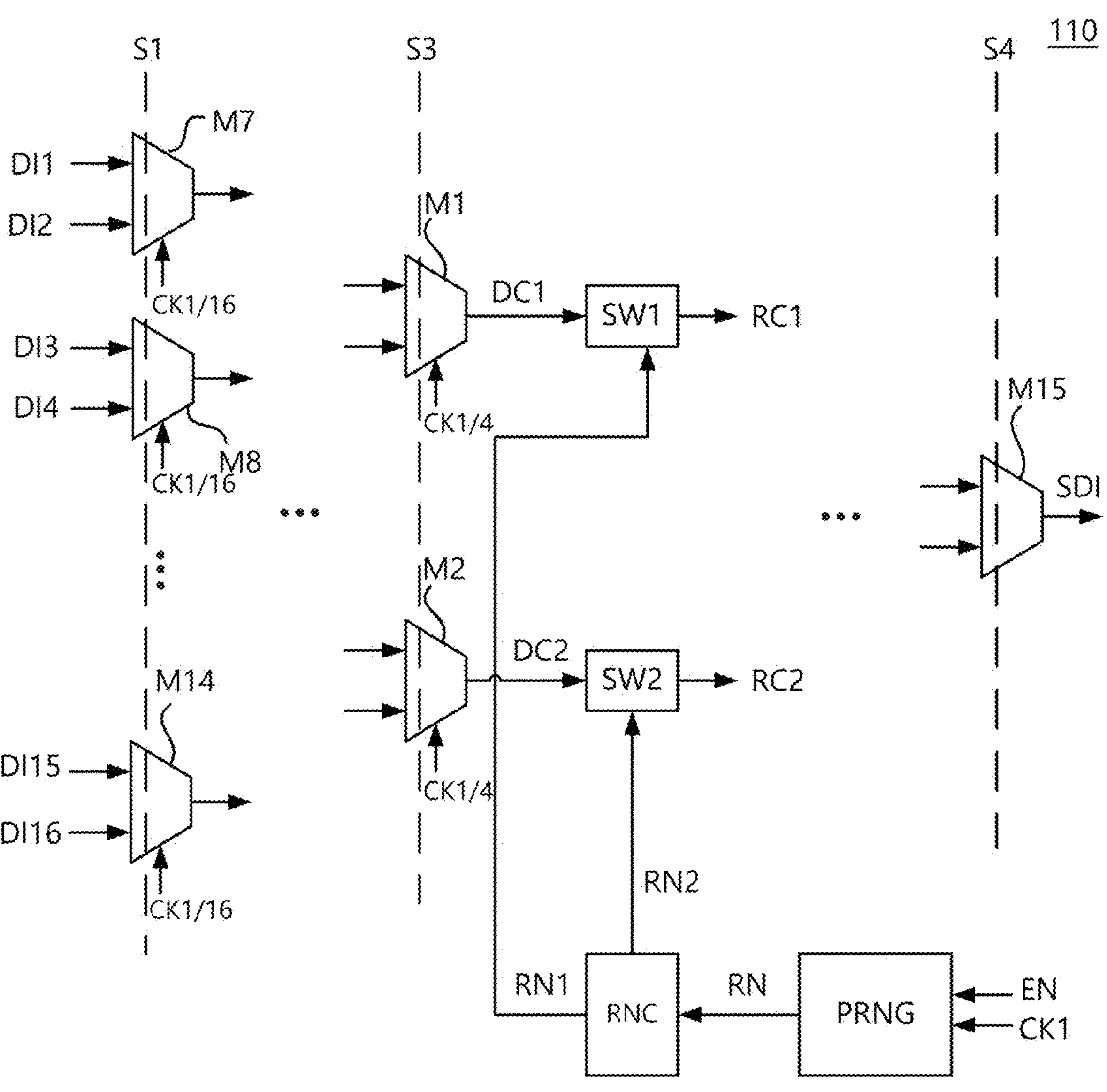

【FIG. 3A】
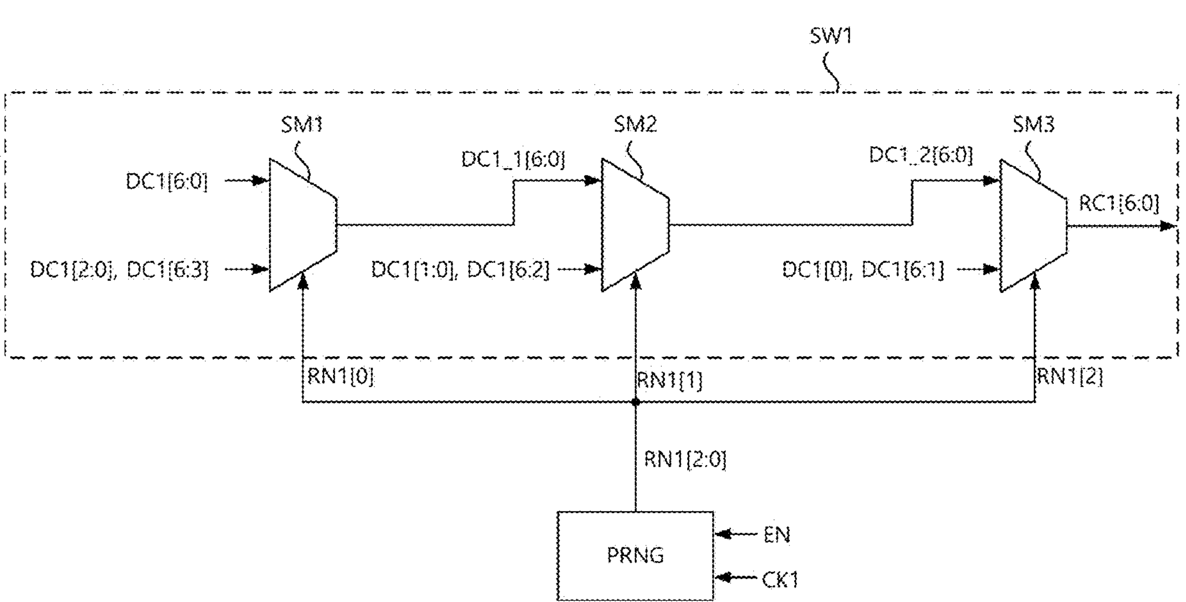

【FIG. 3B】
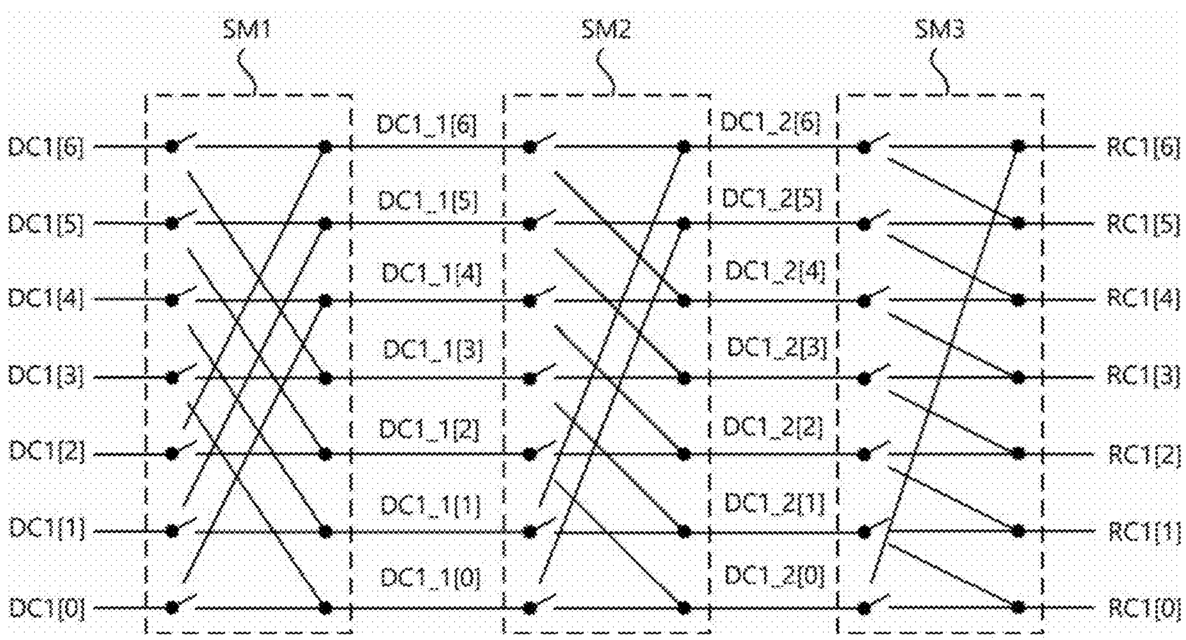

【FIG. 4A】
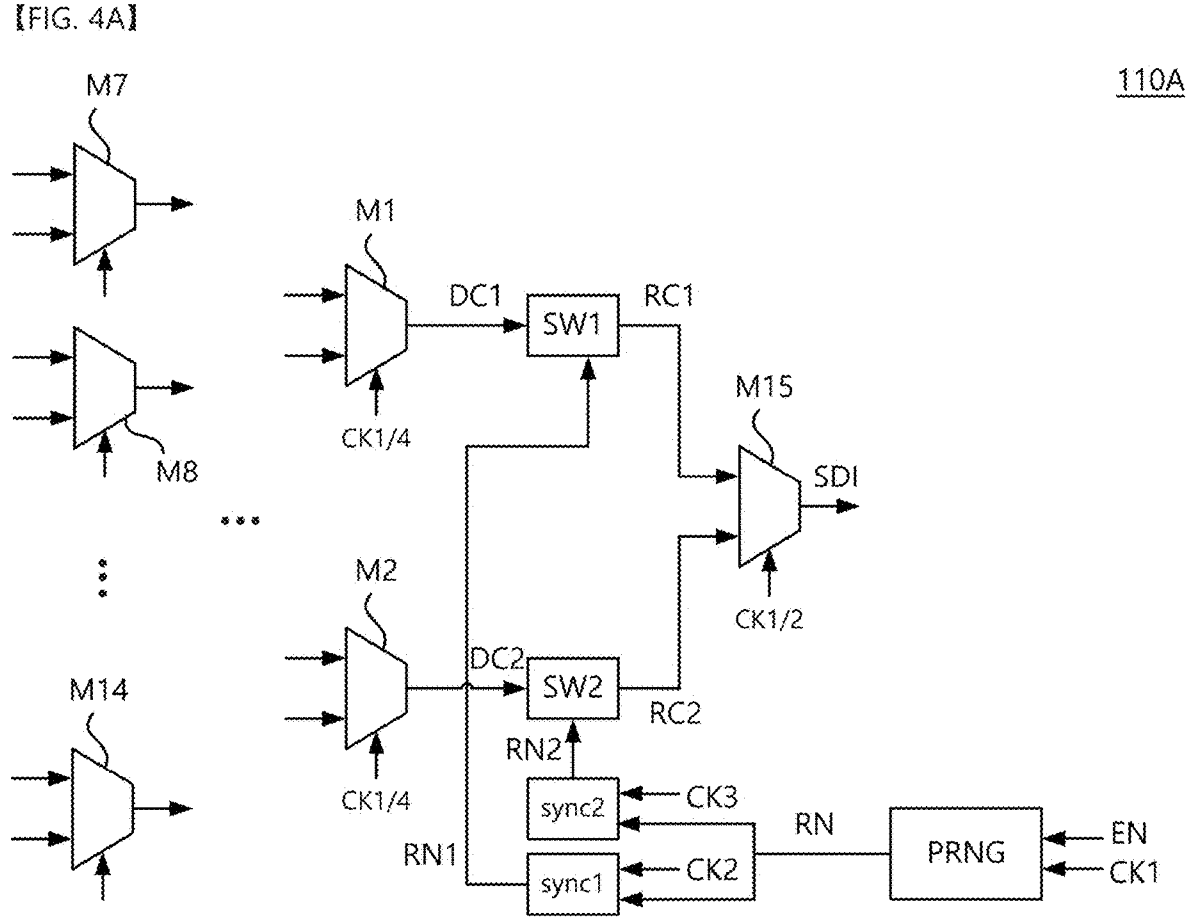

【FIG. 4B】
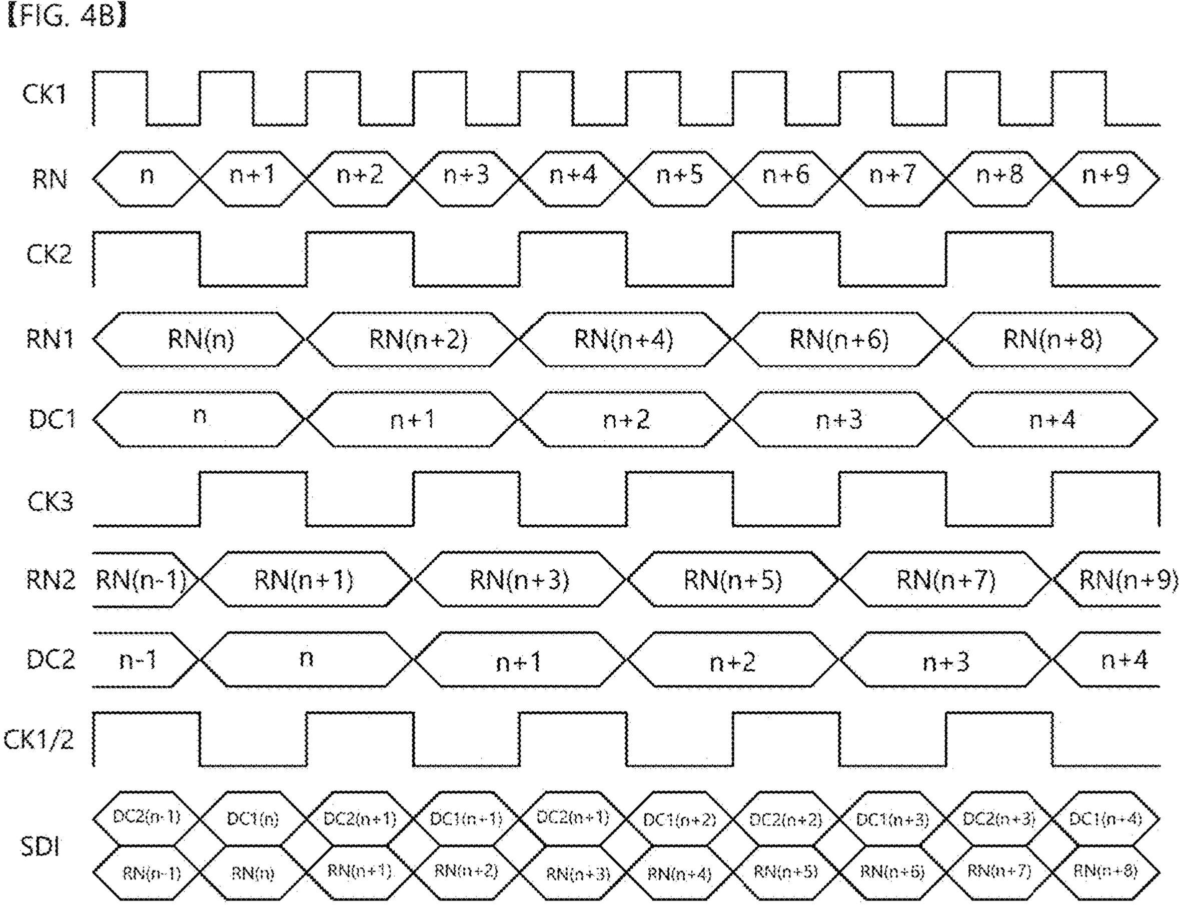

【FIG. 5A】
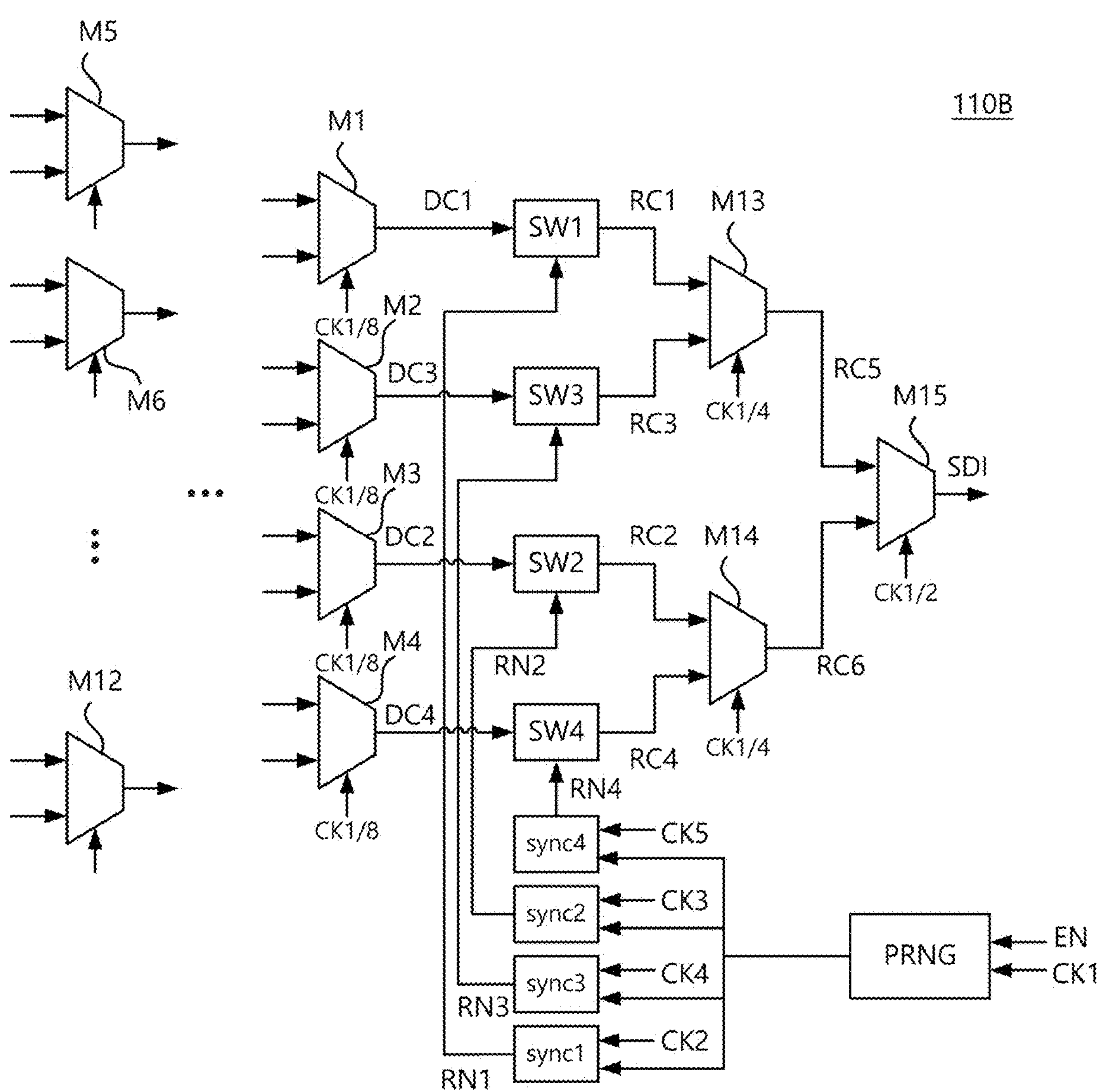

【FIG. 5B】
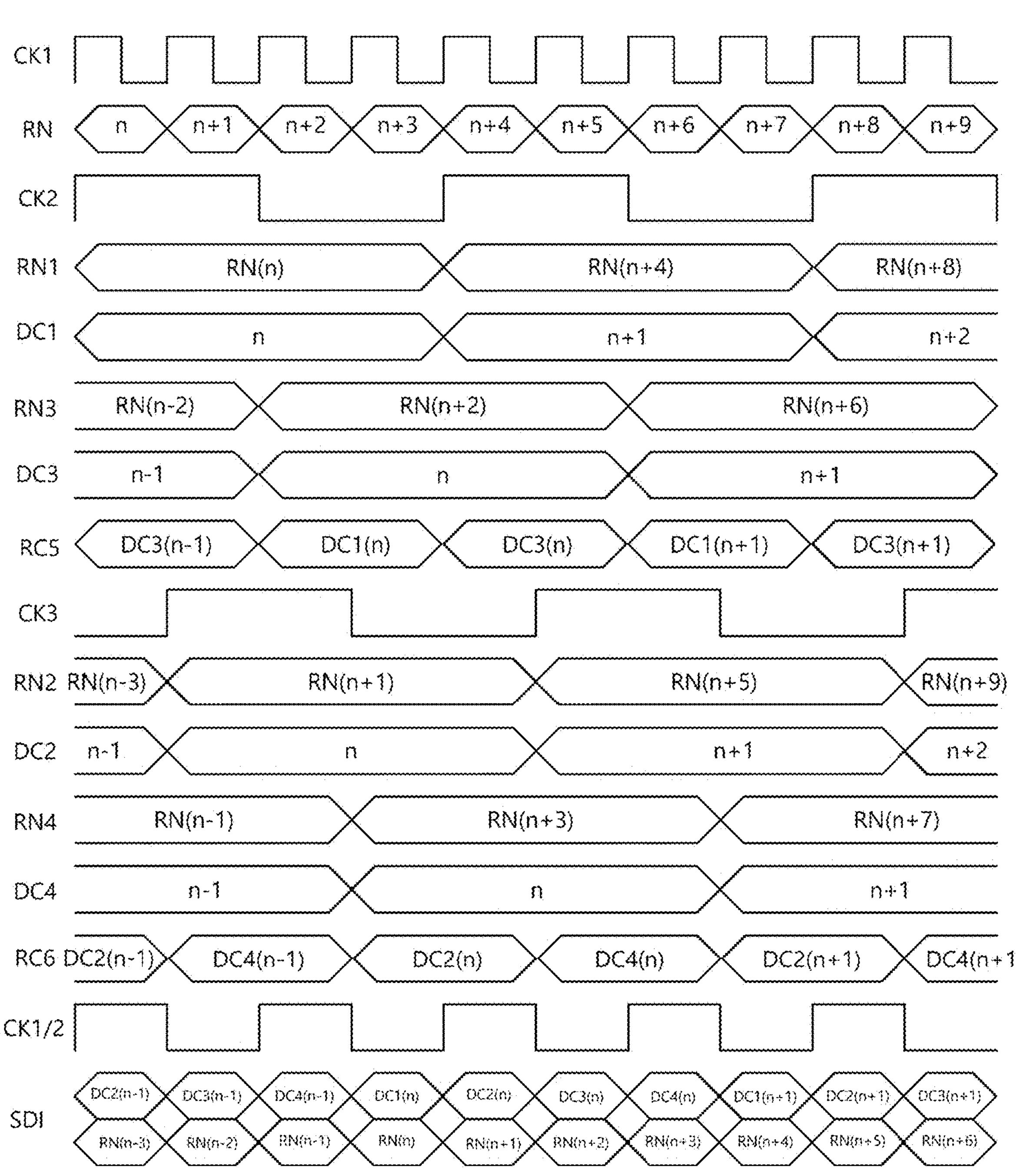

【FIG. 6】
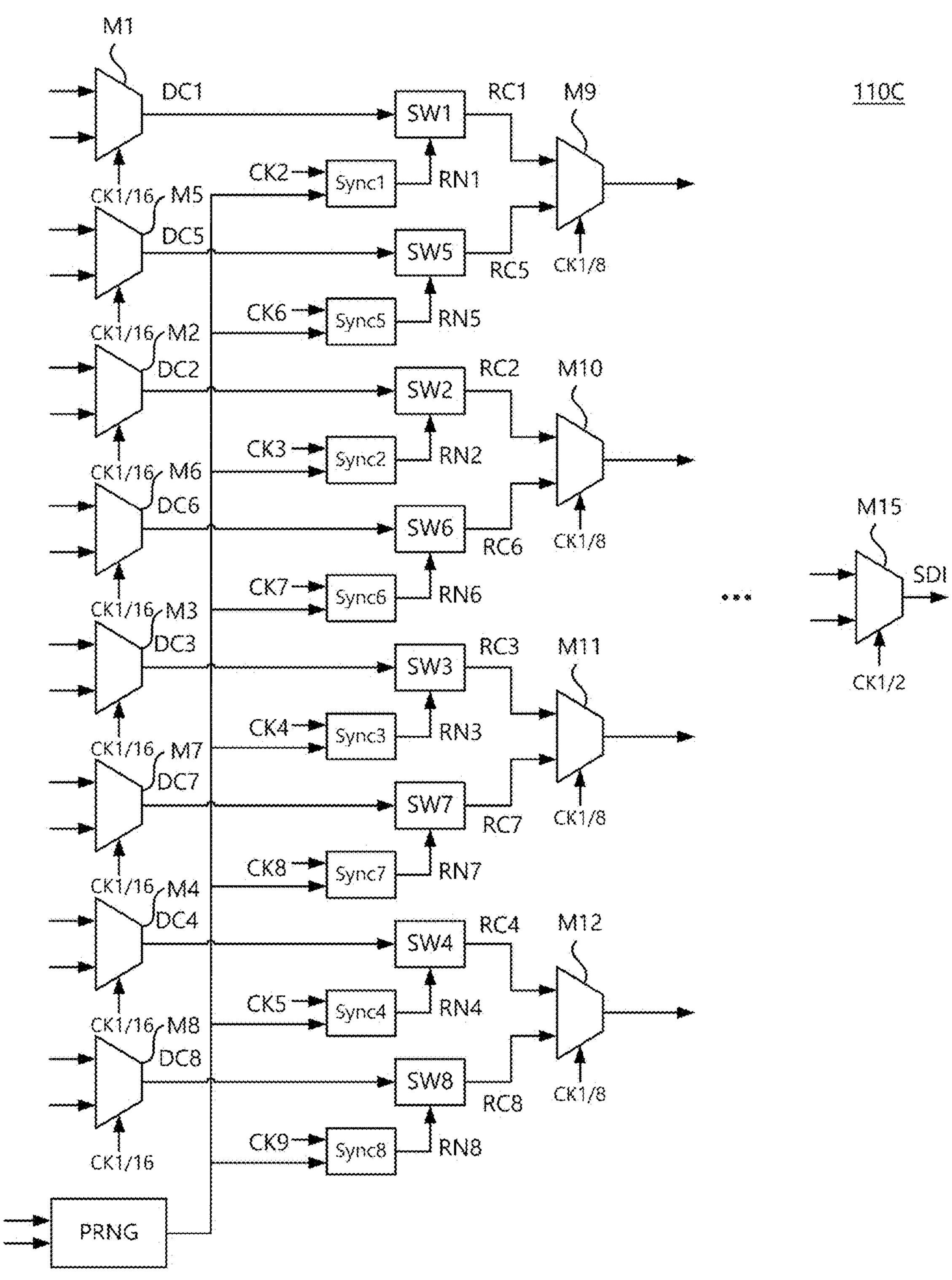

【FIG. 7】
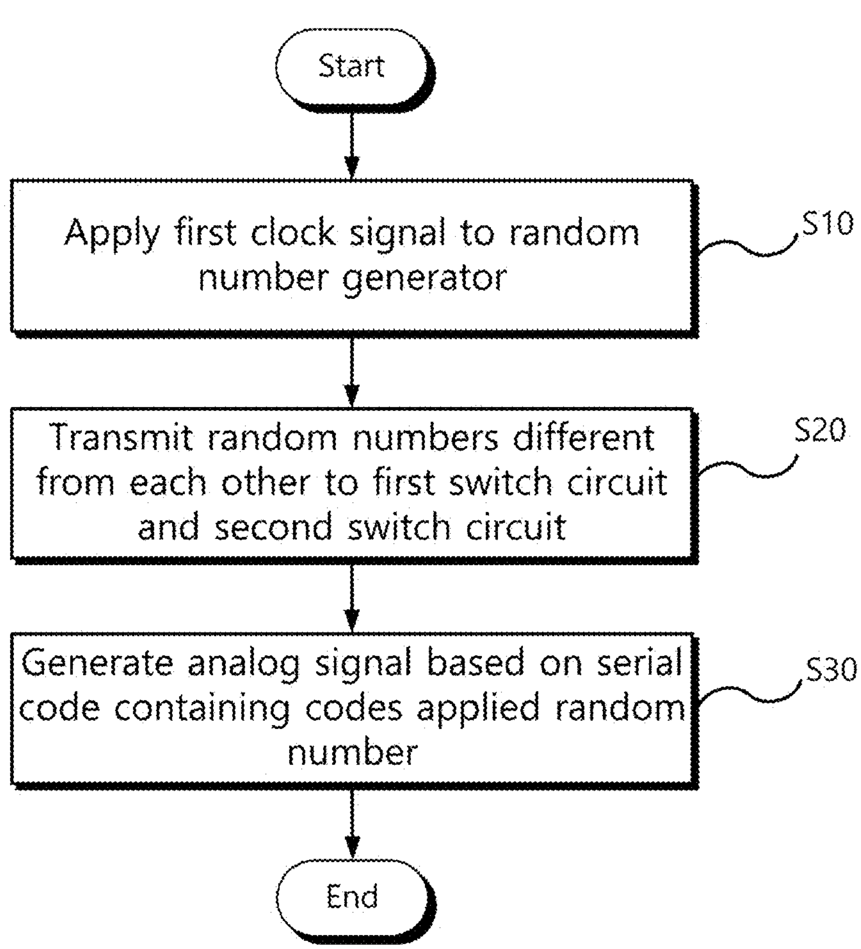

【FIG. 8】
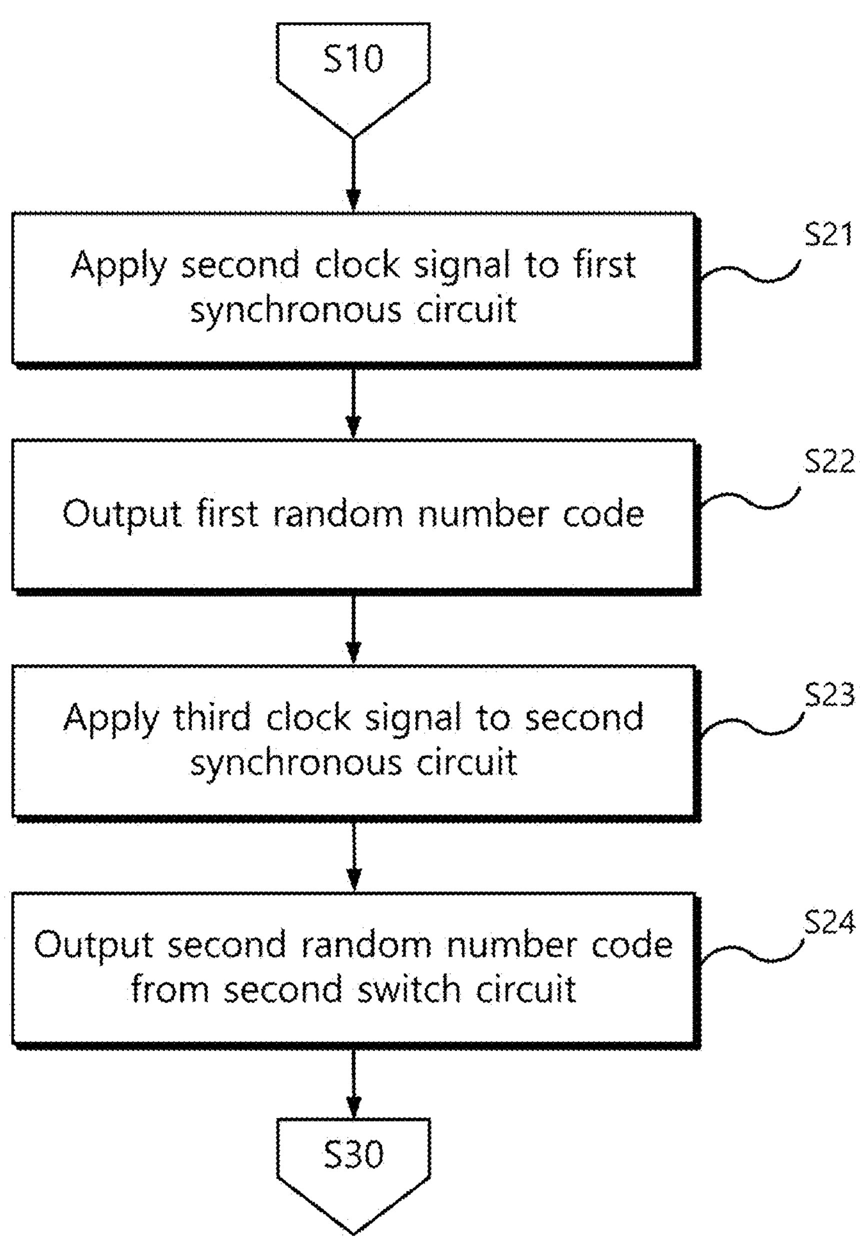

【FIG. 9】
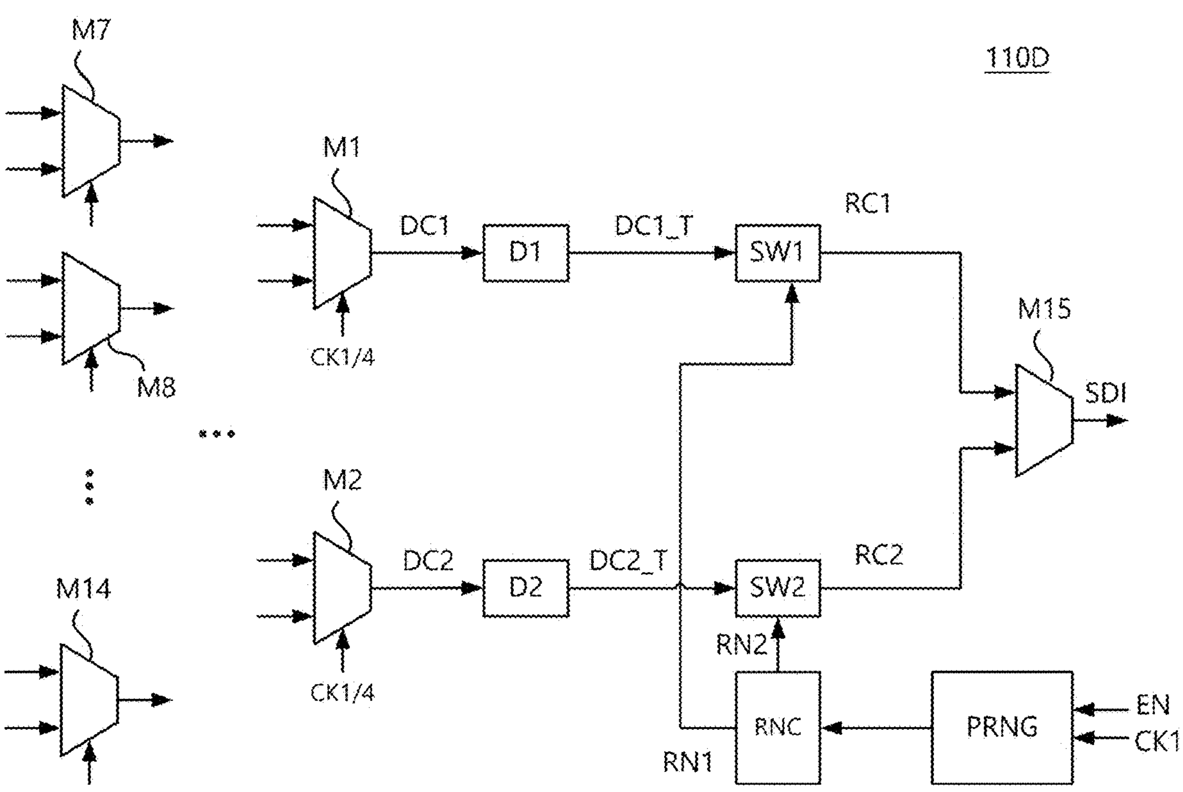

【FIG. 10】
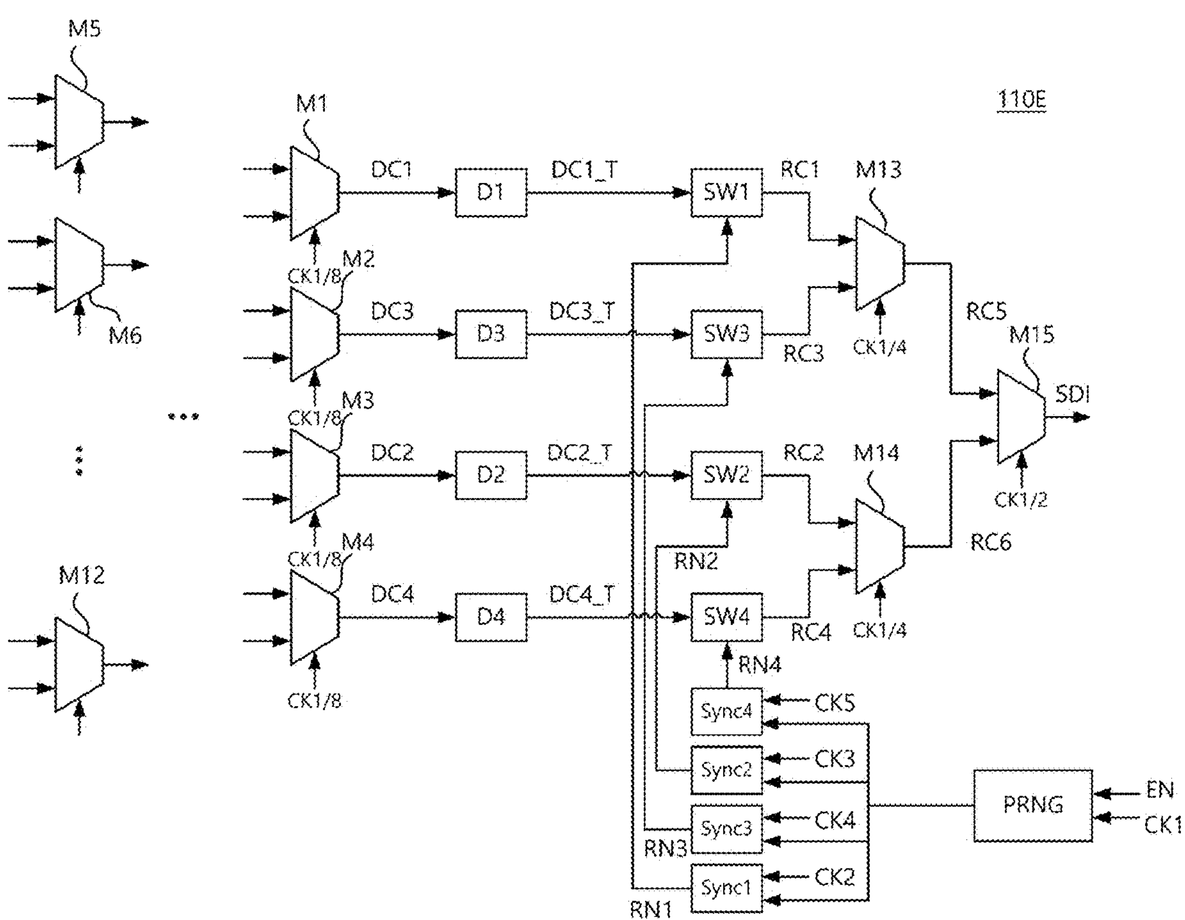

【FIG. 11】
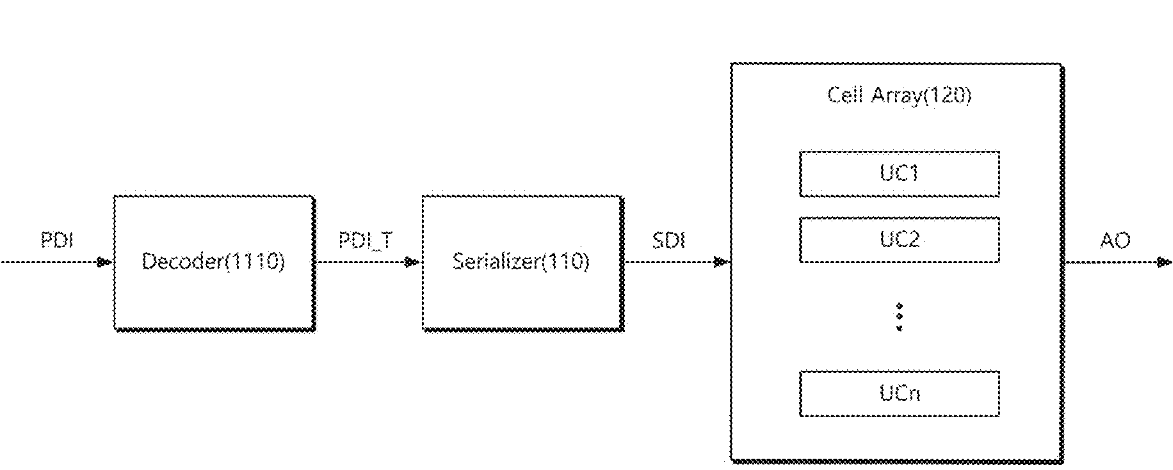

【FIG. 12】
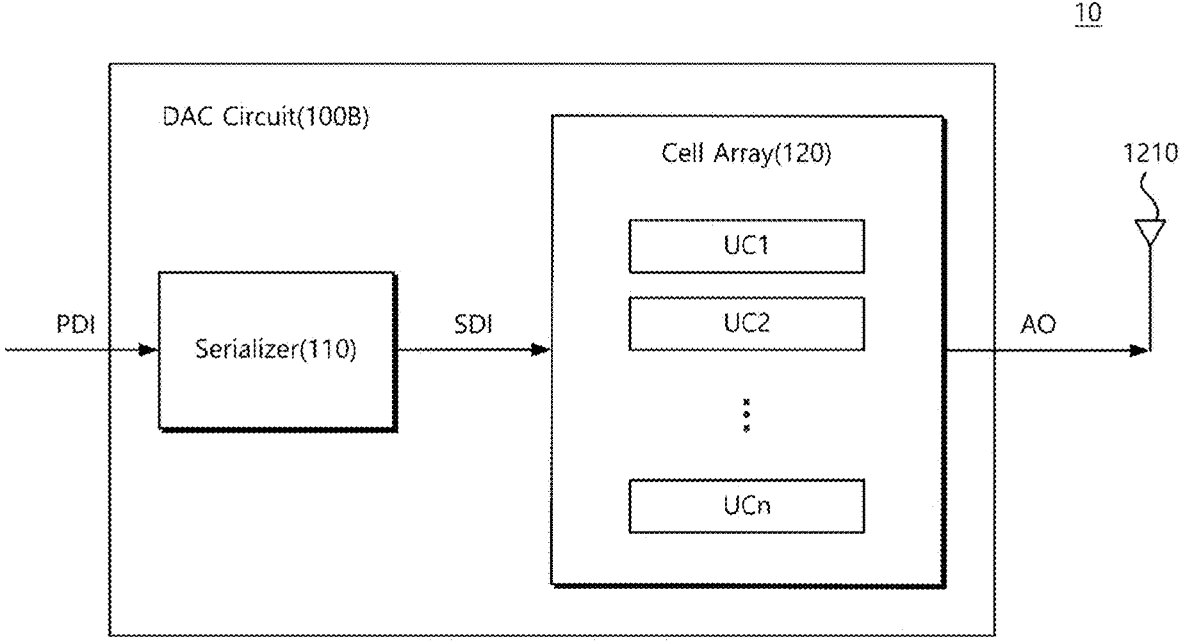

DIGITAL-TO-ANALOG CONVERTER CIRCUIT AND ELECTRONIC DEVICE INCLUDING SAME AND METHOD FOR CONTROLLING SAME

CROSS-REFERENCE TO RELATED APPLICATION

This application claims priority under 35 U.S.C. § 119 to Korean Patent Application No. 10-2023-0164865, filed on Nov. 23, 2023, in the Korean Intellectual Property Office, the disclosure of which is incorporated by reference herein in its entirety.

BACKGROUND

The present disclosure relates to a digital-to-analog converter circuit, an electronic device including the same, and a method of controlling the same.

Analog signals may be converted to signals in digital form that may be easily processed by modern digital systems. In addition, in many systems these signals in digital form may be converted back to signals in analog form to perform actual functions.

The circuit that performs this conversion may be referred to as a digital-to-analog converter (hereinafter referred to as a 'DAC') circuit. In addition, outputs of these DAC circuits are used to drive various devices. The DAC circuits may often be integrated into digital systems in which analog signals are digitized and processed by an analog-to-digital converter (hereinafter referred to as an 'ADC') and then converted back to signals in analog form by the DAC circuit.

Generally, the DAC circuit includes a current array including a plurality of unit cells responsible for output, and various studies are being conducted to improve mismatch between unit cells.

For example, recently, to improve mismatch between such unit cells, studies are being conducted on applying a dynamic element matching (DEM) method to DAC circuits that operate at high resolution and high speed.

SUMMARY

One or more embodiments provide a DAC circuit that improves the quality of analog signals with low power, by generating codes to which different random numbers are applied through a plurality of switch circuits connected between a plurality of multiplexers.

According to an aspect of an embodiment, a digital-to-analog converter (DAC) circuit includes: a serializer circuit including a plurality of multiplexers and configured to convert a parallel code in digital form into a serial code using the plurality of multiplexers; and a cell array including a plurality of unit cells and configured to output an analog signal based on the serial code. The serializer circuit includes: a pseudo random number generation circuit configured to generate random numbers in response to edges of a first clock signal; a first switch circuit connected to a first multiplexer; a second switch circuit connected to a second multiplexer; and a random number circuit configured to transmit different random numbers generated by the pseudo random number generation circuit in response to different edges of the first clock signal to the first switch circuit and the second switch circuit, respectively.

In addition, according to an aspect of an embodiment, a method of controlling a DAC circuit includes: applying a first clock signal to a pseudo random number generation circuit generating random numbers in response to edges of an applied clock signal; transmitting different random numbers generated in response to different edges of the first clock signal from a pseudo random number generation circuit to a first switch circuit connected to a first multiplexer and a second switch circuit connected to a second multiplexer, respectively; and generating an analog signal based on a serial code including codes output from the first switch circuit and the second switch circuit, wherein the codes output from the first switch circuit and the second switch circuit are generated based on the random numbers.

In addition, according to an aspect of an embodiment, an electronic device that transmits and receives an RF (radio frequency) signal, includes: a DAC circuit configured to convert a digital signal into an analog signal; and an antenna configured to output the analog signal as the RF signal. The DAC circuit includes: a serializer circuit including a plurality of multiplexers and configured to convert a parallel code in digital form into a serial code using the plurality of multiplexers; and a cell array including a plurality of unit cells and configured to output the analog signal based on the serial code. The serializer circuit includes: a pseudo random number generation circuit configured to generate random numbers in response to edges of a first clock signal; a first switch circuit connected to a first multiplexer and a second switch circuit connected to a second multiplexer; and a random number circuit configured to transmit different random numbers generated by the pseudo random number generation circuit in response to different edges of the first clock signal to the first switch circuit and the second switch circuit, respectively.

BRIEF DESCRIPTION OF DRAWINGS

The above and other aspects and features will be more clearly understood from the following description of example embodiments, taken in conjunction with the accompanying drawings.

FIG. 1 is a block diagram illustrating a DAC circuit, according to an embodiment.

FIG. 2 is a circuit diagram illustrating a configuration of a serializer, according to an embodiment.

FIG. 3A is a circuit diagram illustrating a configuration for controlling a first switch circuit using a random number, according to an embodiment.

FIG. 3B illustrates a configuration for applying a random number to an input code through a first switch circuit, according to an embodiment.

FIG. 4A is a circuit diagram illustrating a configuration of a serializer, according to an embodiment.

FIG. 4B illustrates a serial code generated through a serializer, according to an embodiment.

FIG. 5A is a circuit diagram illustrating a configuration of a serializer, according to an embodiment.

FIG. 5B illustrates a serial code generated through a serializer, according to an embodiment.

FIG. 6 is a circuit diagram illustrating a configuration of a serializer, according to an embodiment.

FIG. 7 is a flowchart illustrating a method for controlling a DAC circuit, according to an embodiment.

FIG. 8 is a flowchart illustrating a method of generating a random number code to which different random numbers are applied using a first switch circuit and a second switch circuit, according to an embodiment.

FIG. 9 is a circuit diagram illustrating a configuration of a serializer including a first decoder and a second decoder, according to an embodiment.

FIG. 10 is a circuit diagram illustrating a configuration of a serializer including a first decoder to a fourth decoder, according to an embodiment.

FIG. 11 is a circuit diagram illustrating a configuration of a DAC circuit including a decoder connected to a serializer, according to an embodiment.

FIG. 12 is a block diagram illustrating an electronic device including a DAC circuit and an antenna, according to an embodiment.

DETAILED DESCRIPTION

Hereinafter, embodiments will be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram illustrating a DAC circuit, according to an embodiment. FIG. 2 is a circuit diagram illustrating a configuration of a serializer (e.g., a serializer circuit), according to an embodiment.

Referring to FIG. 1, a digital-to-analog converter (hereinafter referred to as a 'DAC') circuit 100 according to an embodiment may include a serializer 110 and a cell array 120.

According to an embodiment, the cell array 120 may include a plurality of unit cells UC1 to UCn. For example, the plurality of unit cells UC1 to UCn may be arranged in a matrix form.

According to an embodiment, the cell array 120 converts an input digital signal (e.g., a serial code SDI) into an analog signal AO using at least some of the plurality of unit cells UC1 to UCn so as to be output.

In more detail, unit cells may be selected based on the serial code SDI input from the serializer 110, and the cell array 120 may output the analog signal AO using the unit cells selected based on the serial code SDI.

For example, the cell array 120 may apply a preset current to the unit cells selected based on the serial code SDI. In addition, the cell array 120 may output the analog signal AO including a voltage signal output when current is applied to at least some of the unit cells.

In this case, for example, each of the plurality of unit cells UC1 to UCn may be referred to as a current cell including at least one resistance element, but embodiments are not limited thereto.

In addition, the DAC circuit 100 according to an embodiment may include the serializer 110 that converts a code input in parallel into a code in serial form so as to be output.

In more detail, the DAC circuit 100 may include the serializer 110 that converts a parallel code PDI in digital form into the serial code SDI using a plurality of multiplexers so as to be output. The serializer 110 may include a plurality of inputs DI1 to DI16. The parallel code PDI may be provided to the plurality of inputs DI1 to DI16 of the serializer 110.

In this case, the parallel code PDI and serial code SDI each have a resolution of 16 bits and may be referred to as signals composed of 7 bits of data, but embodiments are not limited thereto.

Referring to FIGS. 1 and 2 together, the serializer 110 according to an embodiment may include a plurality of multiplexers M1 to M15 arranged to be connected to each other.

In this case, the plurality of multiplexers M1 to M15 may be composed of multiple stages, such as stages S1 to S4.

For example, the plurality of multiplexers M1 to M15 include the first stage S1 including the seventh multiplexer M7 to the fourteenth multiplexer M14, the third stage S3 including the first multiplexer M1 and the second multiplexer M2, and the fourth stage S4 including the output multiplexer M15.

In more detail, each of the multiplexers M1 to M15 according to an embodiment may convert two input signals input in parallel into serial signals in response to a clock signal so as to be output.

For example, the seventh multiplexer M7 may output a first input DI1 in response to the rising edge of a 16-divided clock signal CK1/16 and may output the second input DI2 in response to the falling edge of the 16-divided clock signal CK1/16. The 16-divided clock signal CK1/16 may be understood as a clock signal generated to have one sixteenth the speed of the clock signal.

Through this, the seventh multiplexer M7 may output a signal in which the first input DI1 and the second input DI2 are composed in series. In this case, for example, the signal in which the first input DI1 and the second input DI2 are composed in series may have a speed that is twice the speed of the first input DI1 and the second input DI2.

Accordingly, the serializer 110 may output the serial code SDI in which a plurality of inputs DI1 to DI16 input in parallel are composed in series using the plurality of multiplexers M1 to M15.

In this case, when the parallel code PDI including the plurality of inputs DI1 to DI16 is composed of 7-bit data, it may be understood that each of the plurality of multiplexers M1 to M15 includes 7 multiplexers connected in parallel with each other.

In addition, according to an embodiment, the serializer 110 may include a pseudo random number generator PRNG (e.g., a pseudo random number generation circuit) that generates a random number RN in response to an edge of a first clock signal CK1.

In more detail, the pseudo random number generator PRNG may generate the random number RN according to a specified probability in response to the rising edge of the first clock signal CK1. The pseudo random number generator PRNG may generate random numbers different from each other in response to consecutive rising edges in the first clock signal CK1.

The pseudo random number generator PRNG may generate the random number RN according to a specified probability in response to the rising edge of the first clock signal CK1 when an activation signal EN is input.

In this case, the pseudo random number generator PRNG may generate a pseudo random number according to a specified probability in response to the rising edge of the first clock signal CK1.

In addition, the serializer 110 according to an embodiment may include at least two or more switch circuits SW1 and SW2 respectively connected between two or more multiplexers among the plurality of multiplexers M1 to M15.

In more detail, the serializer 110 may include the first switch circuit SW1 connected to the first multiplexer M1 and the second switch circuit SW2 connected to the second multiplexer M2.

The serializer 110 may include the first switch circuit SW1 that receives a first digital code DC1 output from the first multiplexer M1. In addition, the serializer 110 may include the second switch circuit SW2 that receives a second digital code DC2 output from the second multiplexer M2.

In this case, the first switch circuit SW1 and the second switch circuit SW2 may be disposed between the plurality of stages S1 to S4 composed of some of the multiplexers M1 to M15.

For example, the first switch circuit SW1 and the second switch circuit SW2 may be arranged between the first multiplexer M1 and the second multiplexer M2 included in the third stage S3, and the output multiplexer M15 included in the fourth stage S4, respectively.

However, the arrangement of the first switch circuit SW1 and the second switch circuit SW2 is not limited to the above-described example.

In addition, the serializer 110 according to an embodiment may include a random number circuit RNC that transmits different random numbers, among the random numbers RN generated by the pseudo random number generator PRNG, to the first switch circuit SW1 and the second switch circuit SW2, respectively.

In more detail, the random number circuit RNC may transmit different random numbers RN1 and RN2 generated by the pseudo random number generator PRNG in response to different edges of the first clock signal CK1 to the first switch circuit SW1 and the second switch circuit SW2, respectively.

For example, the random number circuit RNC may transmit the first random number RN1 generated by the pseudo random number generator PRNG in response to one rising edge of the first clock signal CK1 to the first switch circuit SW1.

In addition, the random number circuit RNC may transmit the second random number RN2 generated by the pseudo random number generator PRNG in response to another rising edge of the first clock signal CK1 to the second switch circuit SW2.

In this case, the random number circuit RNC may include a plurality of synchronous circuits that transmit different random numbers RN1 and RN2 to the first switch circuit SW1 and the second switch circuit SW2, respectively, in response to distinct clock signals.

According to an embodiment, the first switch circuit SW1 may output a first random number code RC1 obtained by applying the first random number RN1 to the first digital code DC1 output from the first multiplexer M1.

In addition, the second switch circuit SW2 may output a second random number code RC2 obtained by applying the second random number RN2 to the second digital code DC2 output from the second multiplexer M2.

According to an embodiment, the serializer 110 may output the serial code SDI including codes to which different random numbers generated by the pseudo random number generator PRNG are applied.

In more detail, the serializer 110 may output the serial code SDI composed of random number codes RC1 and RC2 in series in which the random numbers RN1 and RN2 are applied to at least some of the plurality of input codes DI1 to DI16 input in parallel.

In this case, for example, the serial code SDI may have a speed that is an integer multiple of the speed of the plurality of input codes DI1 to DI16.

In addition, in this case, an operation of the serializer 110 applying different random numbers RN1 and RN2 to at least some of the plurality of input codes DI1 to DI16 using the plurality of switch circuits SW1 and SW2 may be referred to as a dynamic element matching technique.

Referring to the above-described configurations, the serializer 110 according to an embodiment includes the plurality of switch circuits SW1 and SW2 that receive the output of each of the multiplexers M1 to M14 excluding the output multiplexer M15 among the multiplexers M1 to M15.

In this case, the speed of the serial code SDI output from the output multiplexer M15 may be relatively high compared to the code output from each of the multiplexers M1 to M14 excluding the output multiplexer M15.

Therefore, the plurality of switch circuits SW1 and SW2 may operate with relatively low power when receiving the output of each of the multiplexers M1 to M14 excluding the output multiplexer M15 compared to the case of receiving the serial code SDI output from the output multiplexer M15.

In detail, because the plurality of switch circuits SW1 and SW2 are disposed between the plurality of stages S1 to S4 composed of the plurality of multiplexers M1 to M15, the plurality of switch circuits SW1 and SW2 may operate with relatively low power compared to the case where they are connected to the output multiplexer M15 and receive the serial code SDI.

Through this, the DAC circuit 100 according to an embodiment may reduce the power consumed in the operation of the switch circuit for applying a random number to the digital code (e.g., the serial code SDI) output through the serializer 110.

In addition, referring to the above-described configurations, the serializer 110 according to an embodiment may use the random number circuit RNC to transmit the different random numbers RN1 and RN2, among the random numbers generated by the pseudo random number generator PRNG, to each of the switch circuits SW1 and SW2.

Accordingly, the serializer 110 may apply the different random numbers RN1 and RN2 to the digital codes DC1 and DC2 output from the different multiplexers M1 and M2.

Through this, the serializer 110 may increase randomness of codes included in the serial code SDI.

In addition, the serializer 110 may increase the randomness of codes included in the serial code SDI to minimize quality degradation of the analog signal AO due to mismatch between the plurality of unit cells UC1 to UCn.

Therefore, the DAC circuit 100 according to an embodiment may improve the quality (e.g., linearity) of the analog signal AO output based on the serial code SDI.

FIG. 3A is a circuit diagram illustrating a configuration for controlling a first switch circuit using a random number, according to an embodiment. FIG. 3B illustrates a configuration for applying a random number to an input code through a first switch circuit, according to an embodiment.

Referring to FIGS. 3A and 3B together, the first switch circuit SW1 according to an embodiment may include a plurality of switch multiplexers SM1, SM2, and SM3 that are controlled by bits of a first random number RN1[2:0] generated by the pseudo random number generator PRNG.

In more detail, the first switch circuit SW1 may use the plurality of switch multiplexers SM1, SM2, and SM3 controlled by the bits of the first random number RN1[2:0] to change the arrangement order of the bits included in the first digital code DC1[6:0].

In this case, the first digital code DC1 may be understood as a 7-bit thermometer code. Accordingly, the first switch circuit SW1 may change the arrangement order of the seven bits of the first digital code DC1[6:0] using the plurality of switch multiplexers SM1, SM2, and SM3. For example, the thermometer code may indicate a unary code, based on unary coding in which a natural number, n, is represented by a code of length n+1 (or n), usually n ones followed by a zero.

The first switch circuit SW1 may include the first switch multiplexer SM1 controlled by a first bit RN1[0] of the first random number RN1[2:0].

In more detail, the first switch multiplexer SM1 may respond to the first bit RN1[0] of the first random number RN1[2:0] to change the arrangement order of some bits among the first digital code DC1[6:0] by 3 bits.

According to an embodiment, the first switch multiplexer SM1 may output an 1-1 digital code DC1_1[6:0] obtained by changing the arrangement order of at least some among the bits of the first digital code DC1[6:0] by 3 bits in response to the first bit RN1[0] of the first random number RN1[2:0].

For example, the first switch multiplexer SM1 may output the 1-1 digital code DC1_1[6:0] having a 7th bit DC1[6], among the bits of the first digital code DC1[6:0], as a 4-1 bit DC1_1[3] in response to the first bit RN1[0] of the first random number RN1[2:0].

According to another embodiment, the first switch multiplexer SM1 may output the 1-1 digital code DC1_1[6:0] having the same arrangement order of the bits of the first digital code DC1[6:0] in response to the first bit RN1[0] of the first random number RN1[2:0].

For example, the first switch multiplexer SM1 may output the 1-1 digital code DC1_1[6:0] having the 7th bit DC1[6], among the bits of the first digital code DC1[6:0], as a 7-1 bit DC1_1[6] in response to the first bit RN1[0] of the first random number RN1[2:0].

In addition, the second switch multiplexer SM2 may change the arrangement order of at least some among the bits of the 1-1 digital code DC1_1[6:0] by 2 bits in response to a second bit RN1[1] of the first random number RN1[2:0].

According to an embodiment, the second switch multiplexer SM2 may output an 1-2 digital code DC1_2[6:0] obtained by changing the arrangement order of at least some among the bits of the first digital code DC1_1[6:0] by 2 bits in response to the second bit RN1[1] of the first random number RN1[2:0].

For example, the second switch multiplexer SM2 may output the 1-2 digital code DC1_2[6:0] having the 7-1 bit DC1_1 [6], among the bits of the 1-1 digital code DC1_1 [6:0], as a 5-2 bit DC1_2 [4] in response to the second bit RN1[1] of the first random number RN1[2:0].

According to another embodiment, the second switch multiplexer SM2 may output the 1-2 digital code DC1_2[6:0] having the same arrangement order of the bits of the 1-1 digital code DC1_1[6:0] in response to the second bit RN1[1] of the first random number RN1[2:0].

For example, the second switch multiplexer SM2 may output the 1-2 digital code DC1_2[6:0] having the 7-1 bit DC1_1 [6] among the bits of the 1-1 digital code DC1_1 [6:0] as the 7-2 bit DC1_2 [6] in response to the second bit RN1[1] of the first random number RN1[2:0].

In addition, the third switch multiplexer SM3 may change the arrangement order of some bits of the 1-2 digital code DC1_2[6:0] by one bit in response to a third bit RN1[2] of the first random number RN1[2:0].

According to an embodiment, the third switch multiplexer SM3 may output a first random number code RC1[6:0] obtained by changing the arrangement order of at least some among the bits of the 1-2 digital code DC1_2[6:0] by 2 bits in response to the third bit RN1[2] of the first random number RN1[2:0].

For example, the third switch multiplexer SM3 may output the first random number code RC1[6:0] having the 7-2 bit DC1_2 [6] of the bits of the 1-2 digital code DC1_2[6:0] as a sixth random number bit RC1[5] in response to the third bit RN1[2] of the first random number RN1[2:0].

According to another embodiment, the third switch multiplexer SM3 may output the first random number code RC1[6:0] having the same arrangement order of the bits of the 1-2 digital code DC1_2[6:0] in response to the third bit RN1[2] of the first random number RN1[2:0].

For example, the third switch multiplexer SM3 may output the first random number code RC1[6:0] having the 7-2 bit DC1_2 [6] of the bits of the 1-2 digital code DC1_2[6:0] as a seventh random number bit RC1[6] in response to the third bit RN1[2] of the first random number RN1[2:0].

Referring to the above-described configurations, the first switch circuit SW1 may output the first random number code RC1[6:0] obtained by applying the first random number RN1[2:0] to the first digital code DC1 using the plurality of switch multiplexers SM1, SM2, and SM3.

In more detail, the first switch circuit SW1 may use the plurality of switch multiplexers SM1, SM2, and SM3 that are controlled by the bits of the first random number RN1[2:0] to output the first random number code RC1 by changing the arrangement order of the bits included in the first digital code DC1.

In addition, referring to FIGS. 2 and 3A together, the second switch circuit SW2 according to an embodiment may be understood to have substantially the same configuration as the first switch circuit SW1.

Therefore, the operation of each of the switch circuits SW1 and SW2 according to embodiments that applies the random numbers RN1 and RN2 to the digital codes DC1 and DC2 may be understood as an operation of changing the arrangement order of bits included in the digital codes DC1 and DC2 based on the random numbers RN1 and RN2.

In addition, the operation of applying random numbers RN1 and RN2 to the digital codes DC1 and DC2 through the switch circuits SW1 and SW2 may be referred to as a dynamic element matching (DEM) technique.

Referring to FIGS. 2, 3A, and 3B together, the first switch circuit SW1 may receive the output of one multiplexer (e.g., the first multiplexer M1) of multiplexers excluding the output multiplexer M15 among the plurality of multiplexers M1 to M15.

In this case, the code output from each of the multiplexers M1 to M14 excluding the output multiplexer M15 may have a relatively low speed compared to the speed of the serial code SDI output from the output multiplexer M15.

Therefore, when the first digital code DC1[6:0] which is the output of the first multiplexer M1 is received, the first switch circuit SW1 may be implemented with relatively few elements compared to the case of receiving the serial code SDI output from the output multiplexer M15.

In addition, when the first digital code DC1[6:0] which is the output of the first multiplexer M1 is received, the first switch circuit SW1 may operate with relatively low power compared to the case of receiving the serial code SDI output from the output multiplexer M15.

Through this, the DAC circuit 100 according to an embodiment may reduce the power consumed in the operation of the switch circuit for applying a random number to the digital code (e.g., the serial code SDI) output through the serializer 110.

FIG. 4A is a circuit diagram illustrating a configuration of a serializer, according to an embodiment. FIG. 4B illustrates a serial code generated through a serializer of FIG. 4A.

Referring to FIGS. 4A and 4B together, a serializer 110A according to an embodiment may include the plurality of multiplexers M1 to M15, the first switch circuit SW1, the second switch circuit SW2, and the pseudo random number generator PRNG, a first synchronous circuit sync1, and a second synchronous circuit sync2.

The serializer 110A illustrated in FIG. 4A may be understood as an example of the serializer 110 illustrated in FIG. 2. Accordingly, the same reference numerals are used for components that are the same or substantially the same as the above-described components, and additional descriptions that may overlap with the above-described content will be omitted to avoid redundancy.

According to an embodiment, the serializer 110A may include the first synchronous circuit sync1 and the second synchronous circuit sync2, which are connected to the pseudo random number generator PRNG.

In more detail, the serializer 110A may include the first synchronous circuit sync1 and the second synchronous circuit sync2 that transmit the random numbers generated at different times in the pseudo random number generator PRNG to the first switch circuit SW1 and the second switch circuit SW2, respectively, in response to different clock signals CK2 and CK3.

The serializer 110A may include the first synchronous circuit sync1 that transmits the first random number RN1, among the random numbers RN generated by the pseudo random number generator PRNG, to the first switch circuit SW1 in response to the second clock signal CK2.

For example, the first synchronous circuit sync1 may transmit random numbers (e.g., RN(n), RN(n+2) to RN(n+8)) generated by the pseudo random number generator PRNG when the rising edge of the second clock signal CK2 occurs to the first switch circuit SW1. For example, the first synchronous circuit sync1 may transmit a first random number (e.g., RN(n)) to the first switch circuit SW1 a first time the rising edge of the second clock signal CK2 occurs, a second random number (e.g., RN(n+2)) to the first switch circuit SW1 a second time the rising edge of the second clock signal CK2 occurs, and a third random number (e.g., RN(n+8)) to the first switch circuit SW1 a third time the rising edge of the second clock signal CK2 occurs.

In addition, the serializer 110A may include the synchronous circuit sync2 that transmits the second random number RN2, among the random numbers RN generated by the pseudo random number generator PRNG, to the second switch circuit SW2 in response to the third clock signal CK3.

For example, the second synchronous circuit sync2 may transmit random numbers (e.g., RN(n−1), RN(n+1) to RN(n+9)) generated by the pseudo random number generator PRNG when the rising edge of the third clock signal CK3 occurs to the second switch circuit SW2. For example, the second synchronous circuit sync2 may transmit a first random number (e.g., RN(n−1)) to the second switch circuit SW2 a first time the rising edge of the third clock signal CK3 occurs, a second random number (e.g., RN(n+1)) to the second switch circuit SW2 a second time the rising edge of the third clock signal CK3 occurs, and a third random number (e.g., RN(n+9)) to the second switch circuit SW2 a third time the rising edge of the third clock signal CK3 occurs.

In this case, for example, the second clock signal CK2 and the third clock signal CK3 may each have a speed that is half the speed of the first clock signal CK1. In addition, for example, the second clock signal CK2 and the third clock signal CK3 may have phases that are opposite to each other.

In addition, in this case, the first random number RN1 and the second random number RN2 may be understood as random numbers generated at different times in the pseudo random number generator PRNG.

Accordingly, the first synchronous circuit sync1 and the second synchronous circuit sync2 may transmit different random numbers generated in response to different rising edges of the first clock signal CK1 from the pseudo random number generator PRNG to the first switch circuit SW1 and the second switch circuit SW2, respectively.

According to an embodiment, the first switch circuit SW1 may output the first random number code RC1 obtained by applying the first random number RN1 to the first digital code DC1.

In more detail, the first switch circuit SW1 may output the first random number code RC1 obtained by applying the first random number RN1 transmitted from the first synchronous circuit sync1 to the first digital code DC1 output from the first multiplexer M1.

In this case, the first random number code RC1 may be understood as a thermometer-type digital code in which at least some of the bits included in the first digital code DC1 are rearranged based on the first random number RN1.

In addition, the second switch circuit SW2 may output the second random number code RC2 obtained by applying the second random number RN2 to the second digital code DC2.

In more detail, the second switch circuit SW2 may output the second random number code RC2 obtained by applying the second random number RN2 transmitted from the second synchronous circuit sync2 to the second digital code DC2 output from the second multiplexer M2.

In this case, the second random number code RC2 may be understood as a thermometer-type digital code in which at least some of the bits included in the second digital code DC2 are rearranged based on the second random number RN2.

According to an embodiment, the serializer 110A may include the output multiplexer M15 that converts the first random number code RC1 and the second random number code RC2 into a serial code and outputs the serial code SDI.

The output multiplexer M15 may receive the first random number code RC1 and the second random number code RC2 from the first switch circuit SW1 and the second switch circuit SW2, respectively.

Furthermore, the output multiplexer M15 may serially convert the first random number code RC1 and the second random number code RC2 received in parallel in response to a 2-divided clock signal CK1/2 so as to be output.

For example, the output multiplexer M15 may output the first random number code RC1 in response to the rising edge of the 2-divided clock signal CK1/2 and may output the second random number code RC2 in response to the falling edge of the 2-divided clock signal CK1/2.

In this case, the 2-divided clock signal CK1/2 may be understood as a clock signal generated to have half the speed of the first clock signal CK1. In addition, for example, the 2-divided clock signal CK1/2 may have the same speed and phase as the second clock signal CK2.

Through this, the output multiplexer M15 may output the serial code SDI having a speed that is twice the speed of the first random number code RC1 and the second random number code RC2.

In this case, when the first digital code DC1 and the second digital code DC2 are received at a relatively low speed, the first switch circuit SW1 and the second switch circuit SW2 may operate with relatively fewer elements compared to the case of receiving the serial code SDI having a relatively high speed.

In this case, when the first digital code DC1 and the second digital code DC2 are received at a relatively low speed, the first switch circuit SW1 and the second switch circuit SW2 may operate with relatively low power compared to the case of receiving the serial code SDI having a relatively high speed.

Through this, the DAC circuit 100 according to an embodiment may reduce the power consumed in the operation of the switch circuit for applying a random number to the serial code SDI output through the serializer 110A.

In addition, the serial code SDI may include the first random number code RC1 and the second random number code RC2 obtained by applying different random numbers to data of the first digital code DC1 and data of the second digital code DC2), respectively.

For example, referring to FIG. 4B, the serial code SDI may include the data of the first random number code RC1 obtained by applying the random number "RN(n+2)" to a "DC1(*n*+1)" of the first digital code DC1 and the data of the second random number code RC2 obtained by applying a random number "RN(n+3)" to a "DC2(*n*+1)" of the second digital code DC2.

In addition, the serial code SDI may include the data of the first random number code RC1 in which a random number "RN(n+4)" is applied to a "DC1(*n*+2)" of the first digital code DC1, and the data of the second random number code RC2 in which a random number "RN(n+5)" is applied to a "DC2(*n*+2)" of the second digital code DC2.

Referring to the above-described configurations, the serializer 110A may use the plurality of switch circuits SW1 and SW2 and the plurality of corresponding synchronous circuits sync1 and sync2 to transmit the random numbers RN1 and RN2 different from each other generated by the pseudo random number generator PRNG to the plurality of switch circuits SW1 and SW2, respectively.

Therefore, the serializer 110A may output the serial code SDI including the random number codes RC1 and RC2 in which the different random numbers RN1 and RN2 are applied to the digital codes DC1 and DC2 output from the different multiplexers M1 and M2.

Through this, the serializer 110A may increase randomness of codes included in the serial code SDI.

In addition, the serializer 110A may minimize quality degradation of the analog signal AO due to mismatch between the plurality of unit cells UC1 to UCn included in the cell array 120 by increasing the randomness of the codes included in the serial code SDI.

Therefore, the DAC circuit 100 according to an embodiment may improve the linearity of the analog signal AO output based on the serial code SDI. In detail, the DAC circuit 100 according to an embodiment may improve the quality of the analog signal AO output based on the serial code SDI.

FIG. 5A is a circuit diagram illustrating a configuration of a serializer, according to an embodiment. FIG. 5B illustrates a serial code generated through a serializer of FIG. 5A.

Referring to FIGS. 5A and 5B together, the serializer 110B according to an embodiment may include the plurality of multiplexers M1 to M15, the first switch circuit SW1, the second switch circuit SW2, a third switch circuit SW3, a fourth switch circuit SW4, the pseudo random number generator PRNG, the first synchronous circuit sync1, the second synchronous circuit sync2, a third synchronous circuit sync3, and a fourth synchronous circuit sync4.

The serializer 110B illustrated in FIG. 5A may be understood as an example of the serializer 110 illustrated in FIG. 2. Accordingly, the same reference numerals are used for components that are the same or substantially the same as the above-described components, and additional descriptions that may overlap with the above-described content will be omitted to avoid redundancy.

According to an embodiment, the serializer 110B may include the first synchronous circuit sync1, the second synchronous circuit sync2, the third synchronous circuit sync3, and the fourth synchronous circuit sync4, which are connected to the pseudo random number generator PRNG.

In more detail, the serializer 110B may include the first synchronous circuit sync1, the second synchronous circuit sync2, the third synchronous circuit sync3, and the fourth synchronous circuit sync4, which transmit the random numbers generated at different times from the pseudo random number generator PRNG to the corresponding switch circuits SW1, SW2, SW3, and SW4, respectively in response to different clock signals CK2, CK3, CK4, and CK5.

The serializer 110B may include the first synchronous circuit sync1 that transmits the first random number RN1, among the random numbers RN generated by the pseudo random number generator PRNG, to the first switch circuit SW1 in response to the second clock signal CK2.

For example, the first synchronous circuit sync1 may transmit random numbers (e.g., RN(n), RN(n+4), and RN(n+8)) generated by the pseudo random number generator PRNG when the rising edge of the second clock signal CK2 occurs to the first switch circuit SW1. For example, the first synchronous circuit sync1 may transmit a first random number (e.g., RN(n)) to the first switch circuit SW1 a first time the rising edge of the second clock signal CK2 occurs, a second random number (e.g., RN(n+4)) to the first switch circuit SW1 a second time the rising edge of the second clock signal CK2 occurs, and a third random number (e.g., RN(n+8)) to the first switch circuit SW1 a third time the rising edge of the second clock signal CK2 occurs.

In addition, the serializer 110B may include the second synchronous circuit sync2 that transmits the second random number RN2, among the random numbers RN generated by the pseudo random number generator PRNG, to the second switch circuit SW2 in response to the third clock signal CK3.

For example, the second synchronous circuit sync2 may transmit random numbers (e.g., RN(n−3), RN(n+1), RN(n+5), and RN(n+9)) generated by the pseudo random number generator PRNG when the rising edge of the third clock signal CK3 occurs to the second switch circuit SW2. For example, the second synchronous circuit sync2 may transmit a first random number (e.g., RN(n−3)) to the second switch circuit SW2 a first time the rising edge of the third clock signal CK3 occurs, a second random number (e.g., RN(n+1)) to the second switch circuit SW2 a second time the rising edge of the third clock signal CK3 occurs, a third random number (e.g., RN(n+5)) to the second switch circuit SW2 a third time the rising edge of the third clock signal CK3 occurs, and a fourth random number (e.g., RN(n+9)) to the second switch circuit SW2 a fourth time the rising edge of the third clock signal CK3 occurs.

In addition, the serializer 110B may include the third synchronous circuit sync3 that transmits a third random number RN3, among the random numbers RN generated by the pseudo random number generator PRNG, to the third switch circuit SW3 in response to the fourth clock signal CK4.

For example, the third synchronous circuit sync3 may transmit random numbers (e.g., RN(n−2), RN(n+2), and RN(n+6)) generated by the pseudo random number generator PRNG when the rising edge of the fourth clock signal CK4 occurs to the third switch circuit SW3. For example, the third synchronous circuit sync3 may transmit a first random number (e.g., RN(n−2)) to the third switch circuit SW3 a first time the rising edge of the third clock signal CK3 occurs, a second random number (e.g., RN(n+2)) to the third switch circuit SW3 a second time the rising edge of the third clock signal CK3 occurs, and a third random number (e.g., RN(n+6)) to the third switch circuit SW3 a third time the rising edge of the third clock signal CK3 occurs.

In this case, the fourth clock signal CK4 may be understood as a clock signal having the same speed as the second clock signal CK2 and having a reverse phase as the second clock signal CK2.

Therefore, the third synchronous circuit sync3 may transmit the random numbers (e.g., RN(n−2), RN(n+2), and RN(n+6)) generated by the pseudo random number generator PRNG when the falling edge of the second clock signal CK2 occurs to the third switch circuit SW3.

In addition, the serializer 110B may include a fourth synchronous circuit sync4 that transmits a fourth random number RN4, among the random numbers RN generated by the pseudo random number generator PRNG, to the fourth switch circuit SW4 in response to a fifth clock signal CK5.

For example, the fourth synchronous circuit sync4 may transmit random numbers (e.g., RN(n−1), RN(n+3), and RN(n+7)) generated by the pseudo random number generator PRNG when the rising edge of the fifth clock signal CK5 occurs to the fourth switch circuit SW4. For example, the fourth synchronous circuit sync4 may transmit a first random number (e.g., RN(n−1)) to the fourth switch circuit SW4 a first time the rising edge of the fifth clock signal CK5 occurs, a second random number (e.g., RN(n+3)) to the fourth switch circuit SW4 a second time the rising edge of the fifth clock signal CK5 occurs, and a third random number (e.g., RN(n+7)) to the fourth switch circuit SW4 a third time the rising edge of the fifth clock signal CK5 occurs.

In this case, the fifth clock signal CK5 may be understood as a clock signal having the same speed as the third clock signal CK3 and having a reverse phase as the third clock signal CK3.

Therefore, the fourth synchronous circuit sync4 may transmit the random numbers (e.g., RN(n−1), RN(n+3), and RN(n+7)) generated by the pseudo random number generator PRNG when the falling edge of the third clock signal CK3 occurs to the third switch circuit SW3.

In this case, for example, the second to fifth clock signals CK2 to CK5 may each have a speed of ¼ of the speed of the first clock signal CK1.

In addition, the first random number RN1, the second random number RN2, the third random number RN3, and the fourth random number RN4 may be understood as random numbers generated at different times in the pseudo random number generator PRNG.

Accordingly, the first synchronous circuit sync1 to the fourth synchronous circuit sync4 may transmit the different random numbers RN1 to RN4 generated in response to the different rising edges of the first clock signal CK1 from the pseudo random number generator PRNG to the first switch circuit SW1 to the fourth switch circuit SW4, respectively.

According to an embodiment, the first switch circuit SW1 may output the first random number code RC1 obtained by applying the first random number RN1 to the first digital code DC1.

In more detail, the first switch circuit SW1 may output the first random number code RC1 obtained by applying the first random number RN1 transmitted from the first synchronous circuit sync1 to the first digital code DC1.

In this case, the first digital code DC1 may be understood as a code in which the first multiplexer M1 responds to the 8-divided clock signal CK1/8, and converts parallel input codes into a serial code so as to be output.

In addition, the first random number code RC1 may be understood as a thermometer-type digital code in which at least some of the bits included in the first digital code DC1 are rearranged based on the first random number RN1.

In addition, the second switch circuit SW2 may output the second random number code RC2 obtained by applying the second random number RN2 to the second digital code DC2.

In more detail, the second switch circuit SW2 may output the second random number code RC2 in which the second random number RN2 transmitted from the second synchronous circuit sync2 is applied to the second digital code DC2.

In this case, the second digital code DC2 may be understood as a code in which the second multiplexer M2 responds to the 8-divided clock signal CK1/8, and converts parallel input codes into a serial code so as to be output.

In addition, the second random number code RC2 may be understood as a thermometer-type digital code in which at least some of the bits included in the second digital code DC2 are rearranged based on the second random number RN2.

In addition, the third switch circuit SW3 may output the third random number code RC3 in which the third random number RN3 is applied to the third digital code DC3.

In more detail, the third switch circuit SW3 may output the third random number code RC3 in which the third random number RN3 transmitted from the third synchronous circuit sync3 is applied to the third digital code DC3.

In this case, the third digital code DC3 may be understood as a code in which the third multiplexer M3 responds to the 8-divided clock signal CK1/8, and converts parallel input codes into a serial code so as to be output.

In addition, the third random number code RC3 may be understood as a thermometer-type digital code in which at least some of the bits included in the third digital code DC3 are rearranged based on the third random number RN3.

In addition, the fourth switch circuit SW4 may output a fourth random number code RC4 obtained by applying the fourth random number RN4 to the fourth digital code DC4.

In more detail, the fourth switch circuit SW4 may output the fourth random number code RC4 in which the fourth random number RN4 transmitted from the fourth synchronous circuit sync4 is applied to the fourth digital code DC4.

In this case, the fourth digital code DC4 may be understood as a code in which the fourth multiplexer M4 responds to the 8-divided clock signal CK1/8, and converts parallel input codes into a serial code so as to be output.

In addition, the fourth random number code RC4 may be understood as a thermometer-type digital code in which at least some of the bits included in the fourth digital code DC4 are rearranged based on the fourth random number RN4.

According to an embodiment, the serializer 110B may include the thirteenth multiplexer M13 that serially converts the first random number code RC1 and the third random number code RC3 and outputs a fifth random number code RC5.

The thirteenth multiplexer M13 may receive the first random number code RC1 and the third random number code RC3 from the first switch circuit SW1 and the third switch circuit SW3, respectively.

Furthermore, the thirteenth multiplexer M13 may serially convert the first random number code RC1 and the third random number code RC3 received in parallel in response to a 4-divided clock signal CK1/4 so as to be output.

For example, the thirteenth multiplexer M13 may output the first random number code RC1 in response to the rising edge of the 4-divided clock signal CK1/4 and may output the third random number code RC3 in response to the falling edge of the 4-divided clock signal CK1/4.

In addition, the serializer 110B may include the fourteenth multiplexer M14 that serially converts the second random number code RC2 and the fourth random number code RC4 and outputs a sixth random number code RC6.

The fourteenth multiplexer M14 may receive the second random number code RC2 and the fourth random number code RC4 from the first switch circuit SW2 and the fourth switch circuit SW4, respectively.

Furthermore, the fourteenth multiplexer M14 may serially convert the second random number code RC2 and the fourth random number code RC4 received in parallel in response to the 4-divided clock signal CK1/4 so as to be output.

For example, the fourteenth multiplexer M14 may output the second random number code RC2 in response to the rising edge of the 4-divided clock signal CK1/4 and may output the fourth random number code RC4 in response to the falling edge of the 4-divided clock signal CK1/4.

In this case, the 4-divided clock signal CK1/4 may be understood as a clock signal generated to have a speed of ¼ of the first clock signal CK1. In addition, for example, the 4-divided clock signal CK1/4 may have the same speed as each of the second to fifth clock signals CK2 to CK5.

Furthermore, the serializer 110B may include the output multiplexer M15 that converts the fifth random number code RC5 and the sixth random number code RC6 into a serial code and outputs the serial code SDI.

The output multiplexer M15 may receive the fifth random number code RC5 and the sixth random number code RC6 from the thirteenth multiplexer M13 and the fourteenth multiplexer M14, respectively.

Furthermore, the output multiplexer M15 may serially convert the fifth random number code RC5 and the sixth random number code RC6 received in parallel in response to the 2-divided clock signal CK1/2 so as to be output.

For example, the output multiplexer M15 may output the fifth random number code RC5 in response to the rising edge of the 2-divided clock signal CK1/2 and may output the sixth random number code RC6 in response to the falling edge of the 2-divided clock signal CK1/2.

In this case, the 2-divided clock signal CK1/2 may be understood as a clock signal generated to have half the speed of the first clock signal CK1.

Through this, the output multiplexer M15 may output the serial code SDI having a speed four times that of the first random number code RC1 to the fourth random number code RC4.

In this case, when the digital codes DC1, DC2, DC3, and DC4 having a relatively low speed are received, the first switch circuit SW1 to the fourth switch circuit SW4 may operate with relatively few elements compared to the case of receiving the serial code SDI having a relatively high speed.

In addition, when the digital codes DC1, DC2, DC3, and DC4 having a relatively low speed are received, the first switch circuit SW1 to the fourth switch circuit SW4 may operate with relatively low power compared to the case of receiving the serial code SDI having a relatively high speed.

Through this, the DAC circuit 100 according to an embodiment may decrease power that is consumed in the operation of the switch circuits SW1, SW2, SW3, and SW4 for applying the random numbers to the serial code SDI output through the serializer 110B.

In addition, the serial code SDI may include the first random number code RC1 to the fourth random number code RC4 in which different random numbers are applied to the data of the first digital code DC1 to the fourth digital code DC4, respectively.

For example, referring to FIG. 5B, the serial code SDI may include the data of the first random number code RC1 in which the random number "RN(n)" is applied to a "DC1(*n*)" of the first digital code DC1.

In addition, the serial code SDI may include the data of the second random number code RC2 in which the random number "RN(n+1)" is applied to a "DC2(*n*)" of the second digital code DC2.

In addition, the serial code SDI may include the data of the third random number code RC3 in which the random number "RN(n+2)" is applied to a "DC3(*n*)" of the third digital code DC3.

In addition, the serial code SDI may include the data of the fourth random number code RC4 in which the random number "RN(n+3)" is applied to a "DC4(*n*)" of the fourth digital code DC4.

Referring to the above-described configurations, the serializer 110B may use the plurality of synchronous circuits sync1 to sync4 to transmit the different random numbers RN1 to RN4, among the random numbers generated by the pseudo random number generator PRNG, to the plurality of switch circuits SW1 to SW4, respectively.

Therefore, the serializer 110B may output the serial code SDI including the random number codes RC1 to RC4 in which the different random numbers RN1 to RN4 are applied to the digital codes DC1 to DC4 output from the different multiplexers M1 to M4, respectively.

Through this, the serializer 110B may increase randomness of codes included in the serial code SDI.

In addition, the serializer 110B may minimize quality degradation of the analog signal AO due to mismatch between the plurality of unit cells UC1 to UCn included in the cell array 120 by increasing the randomness of the codes included in the serial code SDI.

Therefore, the DAC circuit 100 according to an embodiment may improve the linearity of the analog signal AO output based on the serial code SDI. In detail, the DAC circuit 100 according to an embodiment may improve the quality of the analog signal AO output based on the serial code SDI.

FIG. 6 is a circuit diagram illustrating a configuration of a serializer, according to an embodiment.

Referring to FIG. 6, a serializer 110C according to an embodiment may include the plurality of multiplexers M1 to M15, the first switch circuit SW1 to an eighth switch circuit SW8, the pseudo random number generator PRNG, and the first synchronous circuit sync1 to an eighth synchronous circuit sync8.

The serializer 110C illustrated in FIG. 6 may be understood as an example of the serializer 110 illustrated in FIG. 2. Accordingly, the same reference numerals are used for components that are the same or substantially the same as the above-described components, and additional descriptions that may overlap with the above-described content will be omitted to avoid redundancy.

According to an embodiment, the serializer 110C may include the first synchronous circuit sync1 to the eighth synchronous circuit sync8, which are connected to the pseudo random number generator PRNG.

In more detail, the serializer 110C may include the first synchronous circuit sync1 to the eighth synchronous circuit sync8 that transmit random numbers generated at different times in the pseudo random number generator PRNG to the corresponding switch circuits SW1 to SW8, respectively, in response to different clock signals CK2 to CK9.

The serializer 110C may include the first synchronous circuit sync1 that transmits the first random number RN1, among the random numbers RN generated by the pseudo random number generator PRNG, to the first switch circuit SW1 in response to the rising edge of the second clock signal CK2.

The serializer 110C may include the second synchronous circuit sync2 that transmits the second random number RN2, among the random numbers RN generated by the pseudo random number generator PRNG, to the second switch circuit SW2 in response to the rising edge of the third clock signal CK3.

The serializer 110C may include the third synchronous circuit sync3 that transmits the third random number RN3, among the random numbers RN generated by the pseudo random number generator PRNG, to the third switch circuit SW3 in response to the rising edge of the fourth clock signal CK4.

The serializer 110C may include the fourth synchronous circuit sync4 that transmits the fourth random number RN4, among the random numbers RN generated by the pseudo random number generator PRNG, to the fourth switch circuit SW4 in response to the rising edge of the fifth clock signal CK5.

The serializer 110C may include the fifth synchronous circuit sync5 that transmits the fifth random number RN5, among the random numbers RN generated by the pseudo random number generator PRNG, to the fifth switch circuit SW5 in response to the rising edge of the sixth clock signal CK6.

The serializer 110C may include the sixth synchronous circuit sync6 that transmits the sixth random number RN6, among the random numbers RN generated by the pseudo random number generator PRNG, to the sixth switch circuit SW6 in response to the rising edge of the seventh clock signal CK7.

The serializer 110C may include the seventh synchronous circuit sync7 that transmits the seventh random number RN7, among the random numbers RN generated by the pseudo random number generator PRNG, to the seventh switch circuit SW7 in response to the rising edge of the eighth clock signal CK8.

The serializer 110C may include the eighth synchronous circuit sync8 that transmits the eighth random number RN8, among the random numbers RN generated by the pseudo random number generator PRNG, to the eighth switch circuit SW8 in response to the rising edge of the ninth clock signal CK9.

In this case, for example, the second to ninth clock signals CK2 to CK9 may each have a speed of ⅛ of the speed of the first clock signal CK1.

In addition, the first random number RN1, the second random number RN2, the third random number RN3, the fourth random number RN4, the fifth random number RN5, the sixth random number RN6, and the seventh random number RN7, and the eighth random number RN8 may be understood as random numbers generated at different times from the pseudo random number generator PRNG.

Accordingly, the first synchronous circuit sync1 to the eighth synchronous circuit sync8 may transmit the different random numbers generated in response to the different rising edges of the first clock signal CK1 from the pseudo random number generator PRNG to the first switch circuit SW1 to the eighth switch circuit SW8, respectively.

According to an embodiment, the first switch circuit SW1 to the eighth switch circuit SW8 may output the random number codes RC1 to RC8 in which the input random numbers RN1 to RN8 are applied to the input digital codes DC1 to DC8, respectively.

For example, the first switch circuit SW1 may output the first random number code RC1 in which the first random number RN1 is applied to the first digital code DC1.

In this case, the first digital code DC1 may be understood as a code in which the first multiplexer M1 responds to the 16-divided clock signal CK1/16, and converts parallel input codes into a serial code so as to be output.

In addition, the first random number code RC1 may be understood as a thermometer-type digital code in which at least some of the bits included in the first digital code DC1 are rearranged based on the first random number RN1.

For another example, the second switch circuit SW2 may output the second random number code RC2 in which the second random number RN2 is applied to the second digital code DC2.

In this case, the second digital code DC2 may be understood as a code in which the second multiplexer M2 responds to the 16-divided clock signal CK1/16, and converts parallel input codes into a serial code so as to be output.

In addition, the second random number code RC2 may be understood as a thermometer-type digital code in which at least some of the bits included in the second digital code DC2 are rearranged based on the second random number RN2.

According to an embodiment, the serializer 110C may include the ninth multiplexer M9 that serially converts the first random number code RC1 and the fifth random number code RC5 so as to be output.

In more detail, the ninth multiplexer M9 may serially convert the first random number code RC1 and the fifth random number code RC5 received in parallel in response to the 8-divided clock signal CK1/8 so as to be output.

For example, the output multiplexer M15 may output the first random number code RC1 in response to the rising edge of the 8-divided clock signal CK1/8 and may output the fifth random number code RC5 in response to the falling edge of the 8-divided clock signal CK1/8.

In addition, the serializer 110C may include the tenth multiplexer M10 that serially converts the second random number code RC2 and the sixth random number code RC6 so as to be output.

In more detail, the tenth multiplexer M10 may serially convert the second random number code RC2 and the sixth random number code RC6 received in parallel in response to the 8-divided clock signal CK1/8 so as to be output.

For example, the tenth multiplexer M10 may output the second random number code RC2 in response to the rising edge of the 8-divided clock signal CK1/8 and may output the sixth random number code RC6 in response to the falling edge of the 8-divided clock signal CK1/8.

In addition, the serializer 110C may include the eleventh multiplexer M11 that serially converts the third random number code RC3 and the seventh random number code RC7 so as to be output.

In more detail, the eleventh multiplexer M11 may serially convert the third random number code RC3 and the seventh random number code RC7 received in parallel in response to the 8-divided clock signal CK1/8 so as to be output.

For example, the eleventh multiplexer M11 may output the third random number code RC3 in response to the rising edge of the 8-divided clock signal CK1/8 and may output the seventh random number code RC7 in response to the falling edge of the 8-divided clock signal CK1/8.

In addition, the serializer 110C may include the twelfth multiplexer M12 that serially converts the fourth random number code RC4 and the eighth random number code RC8 so as to be output.

In more detail, the twelfth multiplexer M12 may serially convert the fourth random number code RC4 and the eighth random number code RC8 received in parallel in response to the 8-divided clock signal CK1/8 so as to be output.

For example, the twelfth multiplexer M12 may output the fourth random number code RC4 in response to the rising edge of the 8-divided clock signal CK1/8 and may output the eighth random number code RC8 in response to the falling edge of the 8-divided clock signal CK1/8.

In this case, the 8-divided clock signal CK1/8 may be understood as a clock signal generated to have a speed of ⅛ of the first clock signal CK1.

Furthermore, the serializer 110C may include the output multiplexer M15 that converts the two codes, which are converted to serial through each of the plurality of multiplexers M1 to M14 and are received in parallel to serial and outputs the serial code SDI.

In more detail, the output multiplexer M15 may output the codes to which the different random numbers RN1 to RN8 are applied in response to the rising edge and falling edge of the 2-divided clock signal CK1/2.

Through this, the output multiplexer M15 may output the serial code SDI having a speed eight times that of the first random number code RC1 to the eighth random number code RC8.

In this case, when the digital codes DC1 to DC8 having a relatively low speed are received, each of the first switch circuit SW1 to the eighth switch circuit SW8 may operate with relatively few elements compared to the case of receiving the serial code SDI having a relatively high speed.

In addition, when the digital codes DC1 to DC8 having a relatively low speed are received, each of the first switch circuit SW1 to the eighth switch circuit SW8 may operate with relatively low power compared to the case of receiving the serial code SDI having a relatively high speed.

Through this, the DAC circuit 100 according to an embodiment may decrease the power consumed in the operation of the switch circuits SW1 to SW8 for outputting the serial code SDI to which random numbers are applied through the serializer 110C.

In addition, the serial code SDI may include the first random number code RC1 to the eighth random number code RC8 in which different random numbers are applied to the data of the first digital code DC1 to the eighth digital code DC8, respectively.

Referring to the above-described configurations, the serializer 110C may use the plurality of synchronous circuits sync1 to sync8 to transmit the different random numbers RN1 to RN8, among the random numbers generated by the pseudo random number generator PRNG, to the plurality of switch circuits SW1 to SW8, respectively.

Therefore, the serializer 110C may output the serial code SDI including the random number codes RC1 to RC8 in which the different random numbers RN1 to RN8 are applied to the digital codes DC1 to DC8 output from the different multiplexers M1 to M8, respectively.

Through this, the serializer 110C may increase randomness of codes included in the serial code SDI.

In addition, the serializer 110C may minimize quality degradation of the analog signal AO due to mismatch between the plurality of unit cells UC1 to UCn included in the cell array 120 by increasing the randomness of the codes included in the serial code SDI.

Therefore, the DAC circuit 100 according to an embodiment may improve the linearity of the analog signal AO output based on the serial code SDI. In detail, the DAC circuit 100 according to an embodiment may improve the quality of the analog signal AO output based on the serial code SDI.

FIG. 7 is a flowchart illustrating a method for controlling a DAC circuit, according to an embodiment.

Referring to FIG. 7, the DAC circuit 100 according to an embodiment may transmit different random numbers to the plurality of switch circuits SW1 and SW2 and may output the serial code SDI including codes to which different random numbers are applied.

In more detail, the DAC circuit 100 may use the random number circuit RNC to transmit different random numbers generated by the pseudo random number generator PRNG to the plurality of switch circuits SW1 and SW2, and may output the serial code SDI including codes to which different random numbers are applied.

In operation S10, the DAC circuit 100 according to an embodiment may apply the first clock signal CK1 to the pseudo random number generator PRNG.

In more detail, the DAC circuit 100 may apply the first clock signal CK1 to the pseudo random number generator PRNG that generates different random numbers in response to the rising edge of an input clock signal.

In this case, the pseudo random number generator PRNG may be referred to as a pseudo random number generator that generates pseudo random numbers according to a specified probability in response to the rising edge of the input clock signal.

In addition, in this case, the first clock signal CK1 may have the same speed as the speed of the serial code SDI output through the DAC circuit 100.

In operation S20, the DAC circuit 100 according to an embodiment may transmit random numbers different from each other to the first switch circuit SW1 and the second switch circuit SW2.

In more detail, the DAC circuit 100 may transmit the random numbers different from each other that are generated in response to different rising edges of the first clock signal CK1 from the pseudo random number generator PRNG to the first switch circuit SW1 and the second switch circuit SW2, respectively.

For example, the DAC circuit 100 may use the plurality of synchronous circuits that operate in response to clock signals having different phases, and may transmit the random numbers generated at different times from the pseudo random number generator PRNG to the first switch circuit SW1 and the second switch circuit SW2, respectively.

In operation S30, the DAC circuit 100 according to an embodiment may generate the analog signal AO based on the serial code SDI including the codes to which the random numbers are applied.

First, the DAC circuit 100 may generate the serial code SDI including the random number codes RC1 and RC2 that are output by applying different random numbers to the input digital code through each of the switch circuits SW1 and SW2.

For example, the DAC circuit 100 may use the serializer 110 to serially convert the codes including random number codes RC1 and RC2 output from the plurality of switch circuits SW1 and SW2 into a serial code and may output the serial code SDI.

Furthermore, the DAC circuit 100 may generate the analog signal AO through at least some of the plurality of unit cells UC1 to UCn included in the cell array 120, based on the serial code SDI.

In more detail, the DAC circuit 100 (or the cell array 120) may apply a preset current to at least some of the unit cells selected by the serial code SDI among the plurality of unit cells UC1 to UCn, and may generate the analog signal AO including an output voltage signal.

In this case, each of the plurality of unit cells UC1 to UCn may be referred to as a current cell including at least one resistance element.

Referring to the above-described configurations, the DAC circuit 100 according to an embodiment may use the codes to which different random numbers are applied through the plurality of switch circuits SW1 and SW2 to generate the analog signal AO through at least some of the plurality of unit cells UC1 to UCn.

In this case, the DAC circuit 100 may increase the randomness of codes included in the serial code SDI by generating the serial code SDI to include random codes to which different random numbers are applied.

In addition, the DAC circuit 100 may minimize quality degradation of the analog signal AO due to mismatch between the plurality of unit cells UC1 to UCn included in the cell array 120 by increasing the randomness of the codes included in the serial code SDI.

Accordingly, the DAC circuit 100 according to an embodiment may improve the quality of the analog signal AO output based on the serial code SDI.

FIG. 8 is a flowchart illustrating a method of generating a random number code to which different random numbers are applied using a first switch circuit and a second switch circuit, according to an embodiment.

Referring to FIG. 8, the DAC circuit 100 according to an embodiment may use the plurality of synchronous circuits that operate in response to clock signals with different phases, and may transmit random numbers generated at different times from the pseudo random number generator PRNG to the first switch circuit SW1 and the second switch circuit SW2, respectively.

In operation S21, the DAC circuit 100 according to an embodiment may input the second clock signal CK2 to the first synchronous circuit sync1.

In more detail, the DAC circuit 100 may input the second clock signal CK2 having a lower speed than the first clock signal CK1 to the first synchronous circuit sync1.

In this case, for example, the second clock signal CK2 may have a speed that is half the speed of the first clock signal CK1, but embodiments are not limited thereto.

The first synchronous circuit sync1 according to an embodiment may transmit some of the random numbers generated by the pseudo random number generator PRNG to the first switch circuit SW1 in response to the second clock signal CK2.

In more detail, the first synchronous circuit sync1 may transmit the first random number RN1 generated by the pseudo random number generator PRNG to the first switch circuit SW1 when the rising edge of the second clock signal CK2 occurs.

Furthermore, in operation S22, the first switch circuit SW1 according to an embodiment may output the first random number code RC1.

In more detail, the first switch circuit SW1 may output the first random number code RC1 obtained by applying the first random number RN1 transmitted from the first synchronous circuit sync1 to the first digital code DC1.

In this case, the first digital code DC1 may be understood as a digital code input to the first switch circuit SW1 from a multiplexer connected to the first switch circuit SW1.

In operation S23, the DAC circuit 100 according to an embodiment may input the third clock signal CK3 to the second synchronous circuit sync2.

In more detail, the DAC circuit 100 may input the third clock signal CK3 having a lower speed than the first clock signal CK1 to the second synchronous circuit sync2.

In this case, for example, the third clock signal CK3 may have a speed that is half the speed of the first clock signal CK1, but an embodiment is not limited thereto.

In addition, for example, the third clock signal CK3 and the second clock signal CK2 may have reverse phases to each other, but embodiments are not limited thereto.

The second synchronous circuit sync2 according to an embodiment may transmit some of the random numbers generated by the pseudo random number generator PRNG to the second switch circuit SW2 in response to the third clock signal CK3.

In more detail, the second synchronous circuit sync2 may transmit the random number generated by the pseudo random number generator PRNG to the second switch circuit SW2 when the rising edge of the third clock signal CK3 occurs.

In this case, the second digital code DC2 may be understood as a digital code input to the second switch circuit SW2 from a multiplexer connected to the second switch circuit SW2.

Furthermore, in operation S24, the second switch circuit SW2 according to an embodiment may output the second random number code RC2.

In more detail, the second switch circuit SW2 may output the second random number code RC2 in which the second random number RN2 transmitted from the second synchronous circuit sync2 is applied to the second digital code DC2.

Referring to the above-described configurations, the DAC circuit 100 according to an embodiment may transmit different random numbers to the plurality of switch circuits SW1 and SW2 using the plurality of synchronous circuits sync1 and sync2.

Furthermore, the DAC circuit 100 may output the random number codes RC1 and RC2 to which the different random numbers RN1 and RN1 are applied through the plurality of switch circuits SW1 and SW2.

In addition, the DAC circuit 100 may generate the analog signal AO through at least some of the plurality of unit cells UC1 to UCn based on the serial code SDI including the random number codes to which different random numbers are applied.

In this case, the DAC circuit 100 may increase the randomness of codes included in the serial code SDI by generating the serial code SDI to include random codes to which different random numbers are applied.

In addition, the DAC circuit 100 may minimize quality degradation of the analog signal AO due to mismatch between the plurality of unit cells UC1 to UCn included in the cell array 120 by increasing the randomness of the codes included in the serial code SDI.

Therefore, the DAC circuit 100 according to an embodiment may improve the quality (e.g., linearity) of the analog signal AO output based on the serial code SDI.

FIG. 9 is a circuit diagram illustrating a configuration of a serializer including a first decoder and a second decoder, according to an embodiment.

Referring to FIG. 9, the serializer 110D according to an embodiment may include decoders D1 and D2 connected between the switch circuits SW1 and SW2 and the multiplexers M1 and M2, respectively.

In this case, the serializer 110D illustrated in FIG. 9 may be understood as an example of the serializer 110 illustrated in FIGS. 1 and 2. Accordingly, the same reference numerals are used for components that are the same or substantially the same as the above-described components, and additional descriptions that may overlap with the above-described content will be omitted to avoid redundancy.

In more detail, the serializer 110D may include the first decoder D1 connected between the first multiplexer M1 and the first switch circuit SW1.

In addition, the serializer 110D may include the second decoder D2 connected between the second multiplexer M2 and the second switch circuit SW2.

According to an embodiment, the first decoder D1 and the second decoder D2 may convert the digital codes DC1 and DC2 input in binary form into digital codes DC1_T and DC2_T having a thermometer form so as to be output.

In more detail, the first decoder D1 may receive the first digital code DC1 in binary form from the first multiplexer M1. Furthermore, the first decoder D1 may convert the first digital code DC1 having a binary form into the first thermometer code DC1_T having a thermometer form so as to be output.

In addition, the second decoder D2 may receive the second digital code DC2 in binary form from the second multiplexer M2. Furthermore, the second decoder D2 may convert the second digital code DC2 having a binary form into the second thermometer code DC2_T having a thermometer form so as to be output.

In this case, each of the thermometer codes DC1_T and DC2_T having a thermometer form may be formed to correspond to each of the plurality of unit cells UC1 to UCn included in the cell array 120.

Furthermore, the first switch circuit SW1 and the second switch circuit SW2 may output the first random number code RC1 and the second random number code RC2 in which different random numbers are applied to the codes DC1_T and DC2_T converted to the thermometer form, respectively.

For example, the first switch circuit SW1 may output the first random number code RC1 in which the first random number RN1 is applied to the first thermometer code DC1_T.

In addition, the second switch circuit SW2 may output the second random number code RC2 obtained by applying the second random number RN2 to the second thermometer code DC2_T.

According to an embodiment, the serializer 110D (or the output multiplexer M15) may output the serial code SDI including the random number codes RC1 and RC2 to which different random numbers RN1 and RN2 are applied.

In more detail, the output multiplexer M15 may output the serial code SDI including the first random number code RC1 and the second random number code RC2.

For example, the output multiplexer M15 may convert the first random number code RC1 and the second random number code RC2 input in parallel into a serial code and may output them as the serial code SDI.

Referring to the above-described configurations, the serializer 110D according to an embodiment may convert binary form codes into thermometer form codes using the plurality of decoders D1 and D2.

Furthermore, the serializer 110D may output the random number codes RC1 and RC2 obtained by applying the different random numbers RN1 and RN2 to the codes converted into thermometer form through the plurality of switch circuits SW1 and SW2.

In addition, the DAC circuit 100 may generate the analog signal AO through at least some of the plurality of unit cells UC1 to UCn, based on the serial code SDI including the random number codes RC1 and RC2 to which the different random numbers RN1 and RN2 are applied.

In this case, the serializer 110D may increase the randomness of the codes included in the serial code SDI by generating the serial code SDI to include the random number codes RC1 and RC2 to which the different random numbers RN1 and RN2 are applied. In addition, the DAC circuit 100 may minimize quality degradation of the analog signal AO due to mismatch between the plurality of unit cells UC1 to UCn included in the cell array 120 by increasing the randomness of the codes included in the serial code SDI.

Therefore, the DAC circuit 100 according to an embodiment may improve the quality (e.g., linearity) of the analog signal AO output based on the serial code SDI.

FIG. 10 is a circuit diagram illustrating a configuration of a serializer including a first decoder to a fourth decoder, according to an embodiment.

Referring to FIG. 10, the serializer 110E according to an embodiment may include decoders D1 to D4 that are connected between the switch circuit SW1 to SW4 and the multiplexers M1 to M4, respectively.

In this case, the serializer 110E illustrated in FIG. 10 may be understood as an example of the serializer 110 illustrated in FIGS. 1 and 2. Accordingly, the same reference numerals are used for components that are the same or substantially the same as the above-described components, and additional descriptions that may overlap with the above-described content will be omitted to avoid redundancy.

In more detail, the serializer 110E may include the first decoder D1 connected between the first multiplexer M1 and the first switch circuit SW1. In addition, the serializer 110E may include the second decoder D2 connected between the second multiplexer M2 and the second switch circuit SW2. In addition, the serializer 110E may include the third decoder D3 connected between the third multiplexer M3 and the third switch circuit SW3. In addition, the serializer 110E may include the fourth decoder D4 connected between the fourth multiplexer M4 and the fourth switch circuit SW4.

According to an embodiment, the first decoder D1 to the fourth decoder D4 may convert the digital codes DC1 to DC4 input in binary form into the digital codes DC1_T to DC4_T having a thermometer form, respectively, so as to be output.

In more detail, the first decoder D1 may convert the first digital code DC1 received in binary form from the first multiplexer M1 into the first thermometer code DC1_T in thermometer form so as to be output.

In addition, the second decoder D2 may convert the second digital code DC2 received in binary form from the second multiplexer M2 into the second thermometer code DC2_T in thermometer form so as to be output.

In addition, the third decoder D3 may convert the third digital code DC3 received in binary form from the third multiplexer M3 into the third thermometer code DC3_T in thermometer form so as to be output.

In addition, the fourth decoder D4 may convert the fourth digital code DC4 received in binary form from the fourth multiplexer M4 into the fourth thermometer code DC4_T in thermometer form so as to be output.

In this case, each of the thermometer codes DC1_T to DC4_T having the thermometer form may be formed to correspond to each of the plurality of unit cells UC1 to UCn included in the cell array 120.

Furthermore, the first switch circuit SW1 to the fourth switch circuit SW4 may output the first random number code RC1 to the fourth random number code RC1 in which the different random numbers are applied to the codes DC1_T to DC4_T converted in the thermometer form, respectively.

For example, the first switch circuit SW1 may output the first random number code RC1 in which the first random number RN1 is applied to the first thermometer code DC1_T.

In addition, the second switch circuit SW2 may output the second random number code RC2 obtained by applying the second random number RN2 to the second thermometer code DC2_T.

In addition, the third switch circuit SW3 may output the third random number code RC3 obtained by applying the third random number RN3 to the third thermometer code DC3_T.

In addition, the fourth switch circuit SW4 may output the fourth random number code RC4 obtained by applying the fourth random number RN4 to the fourth thermometer code DC4_T.

According to an embodiment, the serializer 110E (or the output multiplexer M15) may output the serial code SDI including the random number codes RC1 to RC4 to which the different random numbers RN1 to RN4 are applied.

In more detail, the output multiplexer M15 may output the serial code SDI including the first random number code RC1 to the fourth random number code RC4.

For example, the output multiplexer M15 may convert the fifth random number code RC5 composed of the first random number code RC1 and the third random number code RC3 in series and the sixth random number code RC6 composed of the second random number code RC2 and the fourth random number code RC4 in series into a serial code, and may output the converted result as the serial code SDI.

Referring to the above-described configurations, the serializer 110E according to an embodiment may convert binary form codes into thermometer form codes using the plurality of decoders D1 and D4, respectively.

Furthermore, the serializer 110E may output the random number codes RC1 to RC4 obtained by applying the different random numbers RN1 to RN4 to the codes converted into the thermometer form through the plurality of switch circuits SW1 to SW4.

In addition, the DAC circuit 100 may generate the analog signal AO through at least some of the plurality of unit cells UC1 to UCn, based on the serial code SDI including the random number codes RC1 to RC4 to which the different random numbers RN1 to RN4 are applied.

In this case, the serializer 110E may increase the randomness of the codes included in the serial code SDI by generating the serial code SDI to include the random number codes RC1 to RC4 to which the different random numbers RN1 to RN4 are applied.

In addition, the DAC circuit 100 may minimize quality degradation of the analog signal AO due to mismatch between the plurality of unit cells UC1 to UCn included in the cell array 120 by increasing the randomness of the codes included in the serial code SDI.

Therefore, the DAC circuit 100 according to an embodiment may improve the quality (e.g., linearity) of the analog signal AO output based on the serial code SDI.

FIG. 11 is a circuit diagram illustrating a configuration of a DAC circuit including a decoder connected to a serializer, according to an embodiment.

Referring to FIG. 11, a DAC circuit 100A according to an embodiment may further include a decoder 1110 connected to the serializer 110.

In this case, the DAC circuit 100A illustrated in FIG. 11 may be understood as an example of the DAC circuit 100 illustrated in FIG. 1. Accordingly, the same reference numerals are used for components that are the same or substantially the same as the above-described components, and additional descriptions that may overlap with the above-described content will be omitted to avoid redundancy.

In more detail, the decoder 1110 may convert a parallel code PDI input in binary form into a thermometer parallel code PDI_T in thermometer form so as to be output.

For example, the decoder 1110 may convert the parallel code PDI of 3 bits having a binary form into the thermometer parallel code PDI_T of 7 bits having a thermometer form so as to be output.

In this case, the thermometer parallel code PDI_T, which has the thermometer form, may include codes corresponding to each of the plurality of unit cells UC1 to UCn included in the cell array 120.

According to an embodiment, the serializer 110 may convert the thermometer parallel code PDI_T that is input in parallel and has the thermometer form into the serial code SDI so as to be output.

In more detail, the serializer 110 may use the plurality of multiplexers M1 to M15, and may output the serial code SDI composed of the codes included in the thermometer parallel code PDI_T input in parallel in the form of a thermometer in series.

In this case, the serializer 110 may output the serial code SDI including codes to which different random numbers are applied using the pseudo random number generator PRNG, the plurality of synchronous circuits, and the plurality of switch circuits.

Through this, the serializer 110 may increase randomness of codes included in the serial code SDI.

Furthermore, the cell array 120 according to an embodiment may use at least some of unit cells selected based on the input serial code SDI, among the plurality of unit cells UC1 to UCn, to generate the analog signal AO so as to be output.

For example, the cell array 120 may apply a preset current to the unit cells selected based on the serial code SDI input from the serializer 110. In addition, the cell array 120 may output the analog signal AO including a voltage signal output when current is applied to at least some of the unit cells.

In this case, for example, each of the plurality of unit cells UC1 to UCn may be referred to as a current cell including at least one resistance element, but embodiments are not limited thereto.

Through the above-described configurations, the DAC circuit 100A may generate the analog signal AO based on the serial code SDI with increased randomness.

In this case, as the randomness of the serial code SDI increases, quality degradation of the analog signal AO due to mismatch between unit cells may be minimized.

Therefore, the DAC circuit 100A according to an embodiment may improve the quality of the analog signal AO output based on the serial code SDI with increased randomness.

FIG. 12 is a block diagram illustrating an electronic device including a DAC circuit and an antenna, according to an embodiment.

Referring to FIG. 12, an electronic device 10 according to an embodiment may include a DAC circuit 100B and an antenna 1210.

In this case, the DAC circuit 100B illustrated in FIG. 12 may be understood as an example of the DAC circuit 100 illustrated in FIG. 1. Accordingly, the same reference numerals are used for components that are the same or substantially the same as the above-described components, and additional descriptions that may overlap with the above-described content will be omitted to avoid redundancy.

In more detail, the electronic device 10 may include the DAC circuit 100B configured to convert a digital signal to an analog signal AO. In this case, the DAC circuit 100B may be understood as a circuit having substantially the same configuration as the DAC circuit 100 illustrated in FIGS. 1 and 2.

According to an embodiment, the serializer 110 may output the serial code SDI by applying different random numbers to each of the codes included in the input parallel code PDI.

Furthermore, the cell array 120 may generate the analog signal AO using unit cells corresponding to codes to which different random numbers are applied in the serial code SDI.

In more detail, the cell array 120 may generate the analog signal AO using unit cells selected by the serial code SDI whose randomness is increased by applying different random numbers to each code.

In this case, each of the plurality of unit cells UC1 to UCn may be understood as a current cell. Accordingly, the cell array 120 may output the analog signal AO including a voltage signal output by applying a preset current to unit cells selected by the serial code SDI.

In this case, the serializer 110 of the DAC circuit 100B may use the pseudo random number generator PRNG, the plurality of synchronous circuits, and the plurality of switch circuits to output the serial code SDI including codes to which different random numbers are applied.

Through this, the serializer 110 may increase randomness of codes included in the serial code SDI.

In addition, the DAC circuit 100B may minimize quality degradation of the analog signal AO due to mismatch between the plurality of unit cells UC1 to UCn by using the serial code SDI with increased randomness.

In addition, the electronic device 10 according to an embodiment may include the antenna 1210 that outputs the analog signal AO output through the DAC circuit 100B to the outside as a radio frequency RF signal.

According to an embodiment, the electronic device 10 may include an analog front end (AFE) that converts the analog signal AO output from the DAC circuit 100B into an RF signal having a preset frequency. In this case, the AFE may be understood as being disposed between the antenna 1210 and the DAC circuit 100B.

According to an embodiment, the antenna 1210 may transmit the analog signal AO output through the DAC circuit 100B to the outside (e.g., a user terminal) as an RF signal with a specified frequency.

According to an embodiment, the antenna 1210 may receive an RF signal transferred from the outside.

As described above, the serializer 110 according to an embodiment may include the plurality of switch circuits SW1 and SW2 that receive output of some of the multiplexers M1 to M15, excluding the output multiplexer M15.

In this case, the speed of the serial code SDI output from the output multiplexer M15 may be relatively high compared to the code output from each of the multiplexers M1 to M14 excluding the output multiplexer M15.

Therefore, the plurality of switch circuits SW1 and SW2 may operate with relatively low power when receiving the outputs of the multiplexers M1 to M14 excluding the output multiplexer M15 compared to the case of receiving the serial code SDI output from the output multiplexer M15.

In addition, the serializer 110 according to an embodiment may transmit the different random numbers RN1 and RN2, among the random numbers generated by the pseudo random number generator PRNG, to the plurality of switch circuits SW1 and SW2, respectively.

Accordingly, the serializer 110 may apply the different random numbers RN1 and RN2 to the digital codes output from the different multiplexers M1 and M2. Through this, the serializer 110 may increase randomness of codes included in the serial code SDI.

In addition, the serializer 110 may increase the randomness of codes included in the serial code SDI to minimize quality degradation of the analog signal AO due to mismatch between the plurality of unit cells UC1 to UCn.

Therefore, the DAC circuit 100 according to an embodiment may improve the linearity of the analog signal AO output based on the serial code SDI. In detail, the DAC circuit 100 according to an embodiment may improve the quality of the analog signal AO output based on the serial code SDI.

According to an embodiment, the DAC circuit may improve the quality of analog signals with low power.

While aspects of embodiments have been particularly shown and described, it will be understood that various changes in form and details may be made therein without departing from the spirit and scope of the following claims.

What is claimed is:

1. A digital-to-analog converter (DAC) circuit comprising:

a serializer circuit comprising a plurality of multiplexers and configured to convert a parallel code in digital form into a serial code using the plurality of multiplexers; and a cell array comprising a plurality of unit cells and configured to output an analog signal based on the serial code, and wherein the serializer circuit comprises:

a pseudo random number generation circuit configured to generate random numbers in response to edges of a first clock signal;

a first switch circuit connected to a first multiplexer;

a second switch circuit connected to a second multiplexer; and a random number circuit configured to transmit different random numbers generated by the pseudo random number generation circuit in response to different edges of the first clock signal to the first switch circuit and the second switch circuit, respectively, wherein the first switch circuit and the second switch circuit output different random number codes in parallel based on the different random numbers.

2. The DAC circuit of claim 1, wherein the random number circuit comprises:

a first synchronous circuit configured to transmit, in response to a second clock signal, a first random number generated by the pseudo random number generation circuit in response to a first edge of the first clock signal to the first switch circuit; and a second synchronous circuit configured to transmit, in response to a third clock signal different from the second clock signal, a second random number generated by the pseudo random number generation circuit in response to a second edge of the first clock signal to the second switch circuit.

3. The DAC circuit of claim 2, wherein the first switch circuit is configured to output a first random number code obtained by applying the first random number to a first digital code output from the first multiplexer, and wherein the second switch circuit is configured to output a second random number code obtained by applying the second random number to a second digital code output from the second multiplexer.

4. The DAC circuit of claim 3, further comprising an output multiplexer configured to serially convert the first random number code and the second random number code input in parallel with each other, to obtain the serial code.

5. The DAC circuit of claim 3, wherein the first switch circuit comprises a first switch multiplexer, a second switch multiplexer, and a third switch multiplexer connected in series with each other, and wherein the first switch circuit is further configured to control the first switch multiplexer, the second switch multiplexer, and the third switch multiplexer using bits of the first random number to output the first random number code.

6. The DAC circuit of claim 2, wherein the serializer circuit further comprises a third switch circuit connected to a third multiplexer and a fourth switch circuit connected to a fourth multiplexer, and wherein the random number circuit comprises:

a third synchronous circuit configured to transmit, in response to a fourth clock signal different from the second clock signal and the third clock signal, a third random number generated by the pseudo random number generation circuit in response to a third edge of the first clock signal to the third switch circuit; and a fourth synchronous circuit configured to transmit, in response to a fifth clock signal different from the second clock signal to the fourth clock signal, a fourth random number generated by the pseudo random number generation circuit in response to a fourth edge of the first clock signal to the fourth switch circuit.

7. The DAC circuit of claim 3, further comprising a plurality of decoders configured to convert a code in binary form into a code in thermometer form, wherein each of the first switch circuit and the second switch circuit is configured to receive the code having the thermometer form.

8. The DAC circuit of claim 7, further comprising:

a first decoder connected between the first multiplexer and the first switch circuit, and configured to convert the first digital code in the binary form output from the first multiplexer into the code having the thermometer form; and a second decoder connected between the second multiplexer and the second switch circuit, and configured to convert the second digital code in the binary form output from the second multiplexer into the code having the thermometer form.

9. The DAC circuit of claim 1, wherein the pseudo random number generation circuit is further configured to generate pseudo random numbers according to a specified probability, respectively, in response to the edges of the first clock signal.

10. The DAC circuit of claim 1, wherein the cell array is further configured to output the analog signal comprising a voltage signal generated by applying a preset current to unit cells selected based on the serial code among the plurality of unit cells.

11. A method of controlling a digital-to-analog converter (DAC) circuit, the method comprising:

applying a first clock signal to a pseudo random number generation circuit generating random numbers in response to edges of an applied clock signal;

transmitting different random numbers generated in response to different edges of the first clock signal from a pseudo random number generation circuit to a first switch circuit connected to a first multiplexer and a second switch circuit connected to a second multiplexer, respectively; and generating an analog signal based on a serial code comprising codes output from the first switch circuit and the second switch circuit, wherein the first switch circuit and the second switch circuit output different random number codes in parallel based on the different random numbers.

12. The method of claim 11, wherein the transmitting of the different random numbers to the first switch circuit and the second switch circuit further comprises:

applying a second clock signal to a first synchronous circuit such that the first synchronous circuit connected to the pseudo random number generation circuit outputs a first random number generated by the pseudo random number generation circuit; and applying a third clock signal different from the second clock signal to a second synchronous circuit such that the second synchronous circuit connected to the pseudo random number generation circuit outputs a second random number different from the first random number.

13. The method of claim 12, further comprising:

outputting, by the first switch circuit, a first random number code obtained by applying the first random number to a first digital code output from the first multiplexer; and outputting, by the second switch circuit, a second random number code obtained by applying the second random number to a second digital code output from the second multiplexer.

14. The method of claim 13, further comprising converting, by an output multiplexer, the first random number code and the second random number code input in parallel with each other to the output multiplexer into the serial code.

15. The method of claim 14, further comprising outputting the analog signal comprising a voltage signal obtained by applying a preset current to unit cells selected based on the serial code among a plurality of unit cells.

16. An electronic device that transmits and receives an RF (radio frequency) signal, the electronic device comprising:

a digital-to-analog converter (DAC) circuit configured to convert a digital signal into an analog signal; and an antenna configured to output the analog signal as the RF signal, wherein the DAC circuit comprises:

a serializer circuit comprising a plurality of multiplexers and configured to convert a parallel code in digital form into a serial code using the plurality of multiplexers; and a cell array comprising a plurality of unit cells and configured to output the analog signal based on the serial code, and wherein the serializer circuit comprises:

a pseudo random number generation circuit configured to generate random numbers in response to edges of a first clock signal;

a first switch circuit connected to a first multiplexer and a second switch circuit connected to a second multiplexer; and a random number circuit configured to transmit different random numbers generated by the pseudo random number generation circuit in response to different edges of the first clock signal to the first switch circuit and the second switch circuit, respectively, and wherein the first switch circuit and the second switch circuit output different random number codes in parallel based on the different random numbers.

17. The electronic device of claim 16, wherein the random number circuit comprises:

a first synchronous circuit configured to transmit, in response to a second clock signal, a first random number generated by the pseudo random number generation circuit in response to a first edge of the first clock signal to the first switch circuit; and a second synchronous circuit configured to transmit, in response to a third clock signal different from the second clock signal, a second random number generated by the pseudo random number generation circuit in response to a second edge of the first clock signal to the second switch circuit.

18. The electronic device of claim 17, wherein the first switch circuit is configured to output a first random number code obtained by applying the first random number to a first digital code output from the first multiplexer, and wherein the second switch circuit is configured to output a second random number code obtained by applying the second random number to a second digital code output from the second multiplexer.

19. The electronic device of claim 17, wherein the serializer circuit further comprises a third switch circuit connected to a third multiplexer and a fourth switch circuit connected to a fourth multiplexer, and wherein the random number circuit comprises:

a third synchronous circuit configured to transmit, in response to a fourth clock signal different from the second clock signal and the third clock signal, a third random number generated by the pseudo random number generation circuit in response to a third edge of the first clock signal to the third switch circuit; and a fourth synchronous circuit configured to transmit, in response to a fifth clock signal different from the second clock signal to the fourth clock signal, a fourth random number generated by the pseudo random number generation circuit in response to a fourth edge of the first clock signal to the fourth switch circuit.

20. The electronic device of claim 16, wherein the cell array is further configured to output the analog signal comprising a voltage signal generated by applying a preset current to unit cells selected based on the serial code among the plurality of unit cells.

* * * * *